United States Patent
Reedy et al.

(10) Patent No.: US 6,667,506 B1
(45) Date of Patent: Dec. 23, 2003

(54) VARIABLE CAPACITOR WITH PROGRAMMABILITY

(75) Inventors: Ronald E. Reedy, San Diego, CA (US); James S. Cable, San Diego, CA (US)

(73) Assignee: Peregrine Semiconductor Corporation, San Diego, CA (US)

(*) Notice: Subject to any disclaimer, the term of this patent is extended or adjusted under 35 U.S.C. 154(b) by 0 days.

(21) Appl. No.: 09/537,806

(22) Filed: Mar. 25, 2000

Related U.S. Application Data

(63) Continuation-in-part of application No. 09/420,952, filed on Oct. 19, 1999.
(60) Provisional application No. 60/128,170, filed on Apr. 6, 1999.

(51) Int. Cl.[7] .............................................. H01L 29/76
(52) U.S. Cl. ..................................... 257/314; 257/288
(58) Field of Search ................................ 257/288, 314, 257/315

(56) References Cited

U.S. PATENT DOCUMENTS

| | | |
|---|---|---|
| 3,500,142 A | 3/1970 | Kahng |
| 3,562,608 A | 2/1971 | Gallagher et al. |
| 3,829,881 A | 8/1974 | Kohashi |
| 3,840,888 A | 10/1974 | Gaensslen et al. |
| 3,919,711 A | 11/1975 | Chou |
| 3,996,657 A | 12/1976 | Simko et al. |
| 4,142,251 A | 2/1979 | Mintz |
| 4,198,649 A | 4/1980 | Berry |
| 4,724,530 A | 2/1988 | Dingwall |
| 4,843,448 A | 6/1989 | Garcia et al. |
| 5,027,171 A | 6/1991 | Reedy et al. |
| 5,300,443 A | 4/1994 | Shimabukuro et al. |
| 5,411,905 A | 5/1995 | Acovic et al. |
| 5,416,043 A | 5/1995 | Burgener et al. |
| 5,455,791 A | 10/1995 | Zaleski et al. |
| 5,492,857 A | 2/1996 | Reedy et al. |
| 5,552,621 A | 9/1996 | Kowalski |
| 5,572,040 A | 11/1996 | Reedy et al. |
| 5,587,947 A | 12/1996 | Chang et al. |
| 5,596,205 A | 1/1997 | Reedy et al. |
| 5,600,169 A | 2/1997 | Burgener et al. |
| 5,619,450 A | 4/1997 | Takeguchi |

(List continued on next page.)

FOREIGN PATENT DOCUMENTS

| | | |
|---|---|---|
| EP | 0516516 A1 | 12/1992 |
| EP | 0570257 A1 | 11/1993 |
| EP | 0896370 | 2/1999 |
| JP | 56021371 | 2/1981 |

OTHER PUBLICATIONS

Gaensslen al., "Field–Effect Transistor Device", IBM Technical Disclosure Bulletin, vol. 13, No. 11, Apr. 1971.

Primary Examiner—Nathan J. Flynn
Assistant Examiner—Leonardo Andújar
(74) Attorney, Agent, or Firm—Steven J. Hultquist; Marianne Fuierer; Yongzhi Yang

(57) ABSTRACT

Multiple variations of a variable capacitor or varactor 10 with built-in programmability; exhibiting high quality, Q, factors; manufactured in a standard CMOS process in silicon on insulator. The cell 10 is manufactured in a standard single polysilicon layer CMOS process applied to silicon on insulator 30 starting substrates. The variable capacitor cell 10 combined with a non-volatile mechanism for programming the tuning range of the varactor 10 results in a varactor 10 which can be tuned and adjusted in an on-chip and purely electronic fashion. The basic variable capacitor cell 10 comprises a floating gate MOS variable capacitor, $C_{MOS}$, in series with a metal to floating gate fixed capacitor $C_{M/FG}$.

24 Claims, 15 Drawing Sheets

U.S. PATENT DOCUMENTS

| | | |
|---|---|---|
| 5,663,570 A | 9/1997 | Reedy et al. |
| 5,689,459 A | 11/1997 | Chang et al. |
| 5,691,552 A | 11/1997 | Oyama |
| 5,721,440 A | 2/1998 | Kowalski |
| 5,780,341 A | 7/1998 | Ogura |
| 5,847,993 A | 12/1998 | Dejenfelt |
| 5,861,336 A | 1/1999 | Reedy et al. |
| 5,863,823 A | 1/1999 | Burgener |
| 5,883,396 A | 3/1999 | Reedy et al. |
| 5,886,376 A | 3/1999 | Acovic et al. |
| 5,895,957 A | 4/1999 | Reedy et al. |
| 5,914,513 A | 6/1999 | Shenai et al. |
| 5,930,638 A | 7/1999 | Reedy et al. |
| 5,973,363 A | 10/1999 | Staab et al. |
| 5,973,382 A | 10/1999 | Burgener et al. |
| 5,982,004 A * | 11/1999 | Sin et al. .................... 257/347 |
| 6,057,555 A | 5/2000 | Reedy et al. |
| 6,177,704 B1 * | 1/2001 | Suzuki et al. ............... 257/329 |
| 6,188,613 B1 * | 2/2001 | Manning ............... 365/185.33 |

* cited by examiner

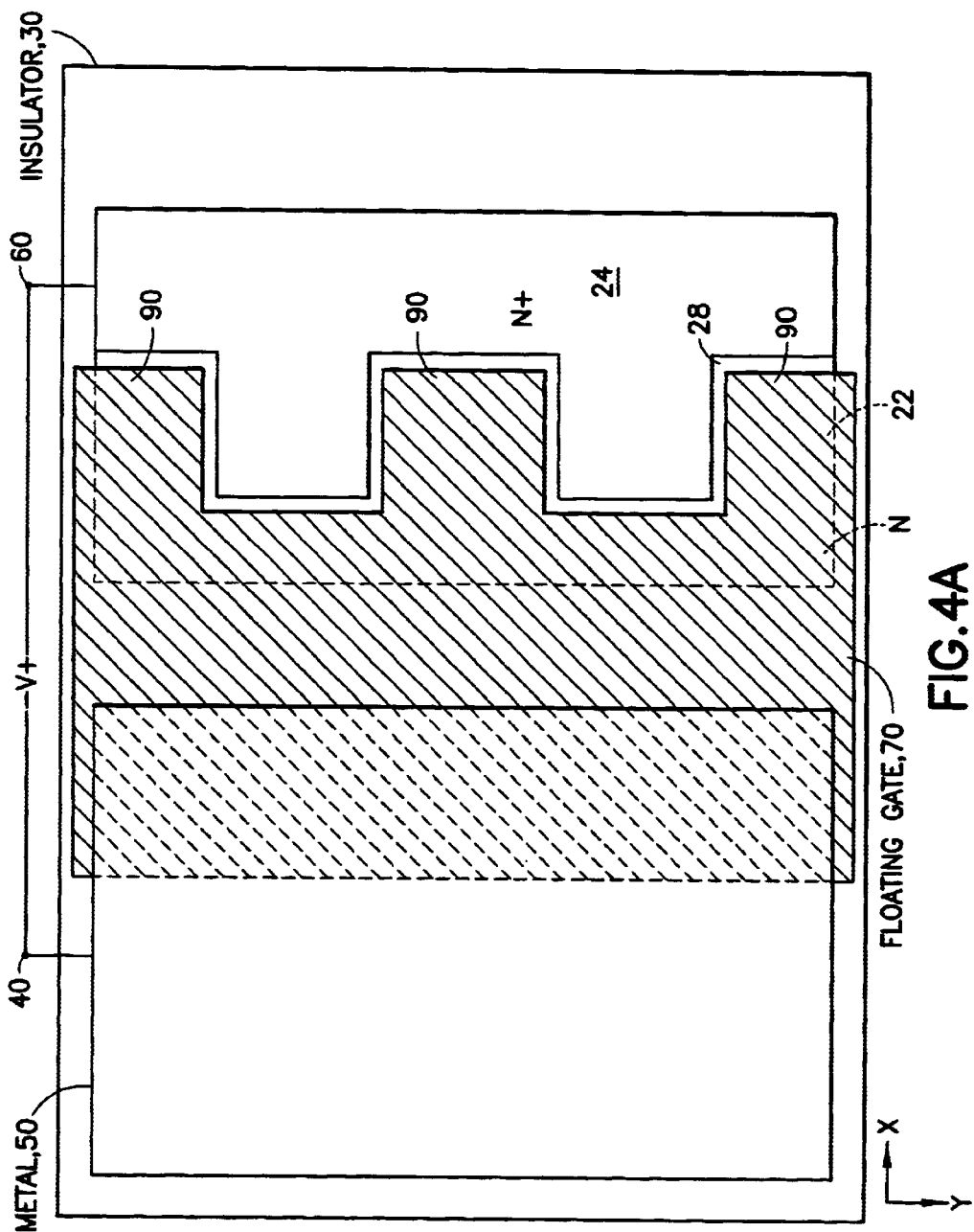

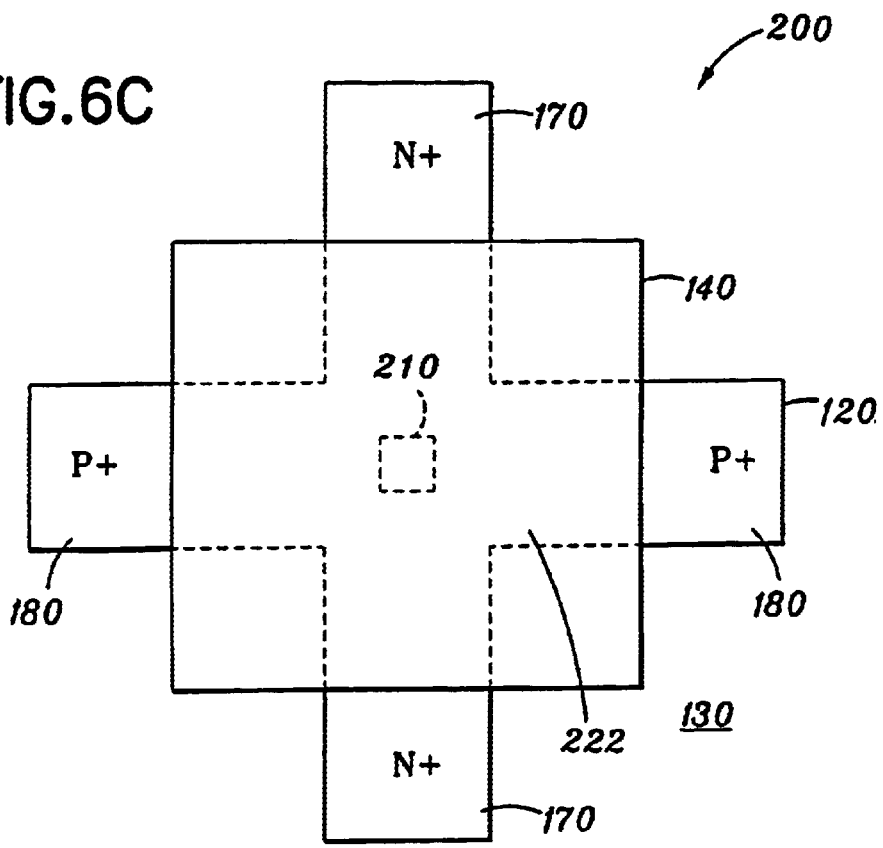
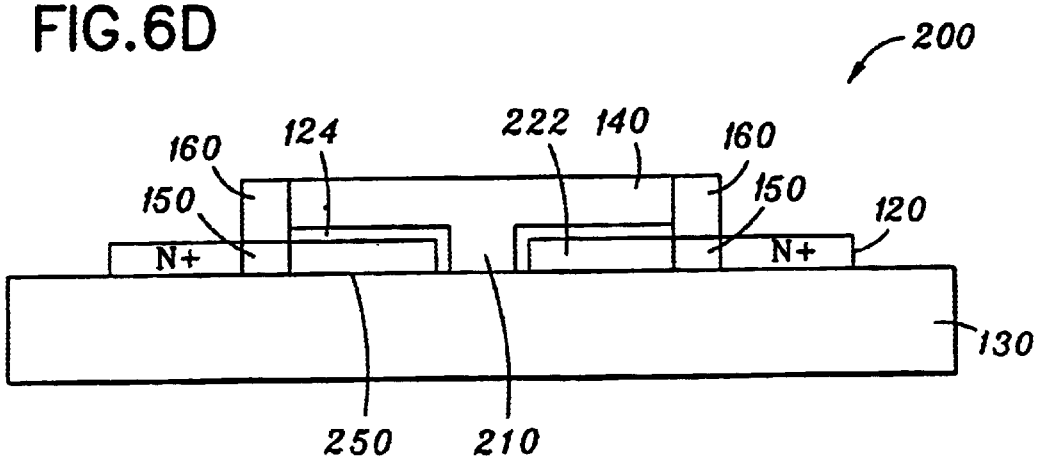

VARIABLE CAPACITOR WITH PROGRAMMABILITY

RELATED APPLICATIONS

This patent application is a continuation-in-part of application Ser. No. 09/420,952; filed on Oct. 19, 1999; by inventors Ronald E. Reedy and James S. Cable; and entitled "An EEPROM Cell on SOI"; which claims priority from provisional patent application Serial No. 60/128,170; filed on Apr. 6, 1999; by inventors Ronald E. Reedy and James S. Cable; and entitled "An EEPROM Cell on SOI". The entirety of application Ser. No. 09/420,952; filed on Oct. 19, 1999; is hereby incorporated herein by reference.

FIELD OF THE INVENTION

The invention relates generally to the field of floating gate devices and more specifically to a programmable variable capacitor which incorporates a floating gate device.

BACKGROUND OF THE INVENTION

General

Electronic devices perform several functions, including digital, analog and memory. Analog devices fall into many categories with one major category being that of frequency selective devices. Examples include voltage-controlled oscillators (VCO), narrow band tuned amplifiers and resonant tuning circuits. In general, frequency selectivity is performed by circuits comprising inductors and capacitors which are assembled in well known circuit topologies such as to exhibit frequency selective behavior. Examples include band-pass filters and input matching networks.

A key characteristic of resonant circuits is bandwidth, which is the frequency band over which the circuit passes a signal. Bandwidth is often described in both absolute terms (measured in Hz) and in relative terms (measured as a percentage of the center frequency). Both wide and narrow bandwidth circuits find widespread application in modern electronic communication systems. Communication systems are often categorized as wired or wireless, but the issues related to frequency selectivity are similar for both cases. In all cases, optimum performance is obtained when a circuit is tuned to ensure that its center frequency and bandwidth are matched to the center frequency and bandwidth of the application.

Many wired and most wireless communication systems (e.g. radios, a term used herein which is understood to refer not only to radios specifically, but to communication systems in general) are considered narrow band in that the entire allowed spectrum (e.g., in a cellular phone system) is typically no more than a few percent of the center frequency. In such systems, resonant circuits are typically tuned by mechanical techniques to align them to the broadcast frequency. Tuning is required because typical components and manufacturing techniques are generally not precise enough to achieve the desired alignment with the broadcast frequency accurately and inexpensively.

In many communication systems, it may also be necessary to adjust the frequency of individual devices. In the cellular phone example, multiple handsets operate within a single cell and it is often necessary that each phone operate at an assigned frequency (a so-called channel) that can vary from cell to cell and even from call to call. Such frequency agility is typical of wireless systems including AM/FM radios, television (both broadcast and cable), cell phones, pagers, mobile radios and virtually all other modern communications systems. It may also be desirable for a communication system to operate in multiple bands, which currently requires multiple tuned circuits. If a single circuit could be re-tuned, significant cost, weight and power consumption would be realized. These requirements for all forms of frequency agility place numerous requirements on the design and manufacture of the electronic devices performing communications functions.

Tuned Circuits

Tuned circuits exhibit a response that is dependent on the frequency of an applied signal. The simplest tuned circuit is an L-C circuit, a circuit that is well known in the electronics industry. In the absence of any resistance, a pure L-C circuit would respond to a radian frequency of $(1/LC)^{1/2}$, where L is the inductance and C is the capacitance. Hence doubling the value of the capacitance would reduce the center frequency by about 30%. This pure L-C circuit would also have an infinitely high Q. However, including resistance of the inductor, capacitor and wires of a non-ideal, i.e. real or physical, L-C circuit reduces the Q to values typically between 10 and 100.

Many variations on the tuned circuit theme have been used, including multiple components connected in an almost infinite number of topologies. Each topology has a characteristic response, but in general, their key features are center frequency, bandwidth and transition region. In each design, tradeoffs between efficiency (high Q) and bandwidth (typically wider for lower Q) must be tolerated and acceptable compromises determined. In general, a radio's bandwidth is first determined by the system specification, then the highest Q components that are consistent with the system cost and specification are selected. However, since all components have manufacturing variations, tuned circuits usually require adjustment to get them to operate at their designed frequency.

Certain tuned circuits are designed to operate in a narrow segment (channel) of a system's bandwidth. Such circuits are critically important to a radio's performance since they must be much narrower than the overall system and they must be frequency agile. The most common such circuit is the aforementioned VCO. The element within the VCO that actually causes frequency shifting is a variable capacitor, also referred to as a varactor.

Varactors

Frequency agility is usually provided by a circuit which changes frequency in response to an applied voltage, i.e., a circuit often referred to as a voltage controlled oscillator, or VCO. Typically, a VCO circuit includes a component referred to as a varactor (contraction of variable-capacitor) or varicap or voltacap, i.e., a capacitor which changes value in response to an applied voltage. The term varactor will be used herein to refer to all of these types of devices. Presently, many varactors are made from semiconductor materials such as silicon and utilize devices that typically include a p-n junction (e.g., a diode). These devices use the well-known effect that a diode's depletion capacitance decreases as the D-C voltage applied across the p-n junction increases (when applied in a reverse bias condition). While such devices provide the variable capacitance required to adjust the tuning of a resonant circuit, they have numerous drawbacks, including relatively high resistance (hence a low quality factor, Q), large variations in their value of capacitance and large variations in their voltage sensitivity. Nonetheless, these devices are found in most modern radios.

Quality factor, Q, is a ratio of the capacitive effect to the resistive effect with high Q values being desirable. In diode varactors, it is necessary to use highly resistive material to form the variable capacitance, which in turn creates relatively high resistance. In this type of device, Q factors above 10 at 2 GHz are considered good, and are often listed as high-Q devices. Highly resistive material is also highly sensitive to variations in its processing conditions, which in turn causes large variations in the value of capacitance and the change in capacitance per unit applied voltage. In production, a typical high Q varactor design can exhibit a 30–50% variation in its capacitance values from component to component, even though the same materials and manufacturing processes are used to produce the individual components.

These variations in component value result in errors in the frequency of the VCO. These frequency errors are often greater than the entire bandwidth of the system; hence the radio operates incorrectly (and often in violation of license limits). To correct for this error and the combined errors of other critical components, most modern VCO's are tuned to the correct frequency in a labor-intensive, expensive and often mechanical process. For example, it is often necessary to use mechanical tuning capacitors and laser-trimmed capacitors.

SUMMARY OF THE INVENTION

The present invention addresses the above described shortcomings in varactor design and production. The present invention provides a design and method for producing a superior varactor which can be electronically tuned and shipped with improved accuracy and which can be electronically tuned in the assembled circuit to permit for correction of errors due to other components in the circuit. When compared to currently available varactors, the varactor of the present invention exhibits higher Q factors and reduced variation in critical parameters. For example, while conventional diode varactors exhibit a Q of about 10 at 2 GHz, the varactor of the present invention exhibits a Q of from approximately 20–40 at 2 GHz, depending on the layout of the device. Additionally, while conventional diode varactors typically exhibit errors in the actual value of capacitance in the range of 30–50% as compared to the intended design value, the varactor of the present invention exhibits errors of less than approximately 5% from the intended design value.

In a first aspect, the present invention is a variable capacitor comprising: an insulating substrate; a first semiconductive region formed on the insulating substrate; a first electrode electrically coupled to the first semiconductive region; a first gate which is electrically floating and is capacitively coupled to the first semiconductive region, wherein a capacitance $C_1$ represents the capacitive coupling between the floating first gate and the first semiconductive region; a conducting region capacitively coupled to the floating first gate, wherein a capacitance $C_2$ represents the capacitive coupling between the conducting region and the floating first gate; and a second electrode electrically coupled to the conducting region. In some configurations, the insulating substrate further comprises sapphire. In some configurations, the variable capacitor may further comprise a second semiconductive region formed on the insulating substrate wherein the first semiconductive region is electrically coupled to the second semiconductive region which is electrically coupled to the first electrode. Additionally, the first semiconductive region may further comprise an N type semiconductor and the second semiconductive region may further comprise an $N^+$ type semiconductor. Some configurations of the variable capacitor may further comprise at least one electrically insulating region which electrically insulates the first semiconductive region, the floating first gate and the conducting region from each other, wherein the first capacitance $C_1$ between the floating first gate and the first semiconductive region may further comprise an insulator/oxide capacitance $C_{OX}$ and a depletion capacitance $C_{DEP}$ wherein the depletion capacitance $C_{DEP}$ varies as a function of a voltage applied between the first and second electrodes. In some configurations, the variable capacitor exhibits a first total capacitance $C_{T1}$ when a voltage $V_1$ is applied between the first and second electrodes and a second total capacitance $C_{T2}$ when a voltage $V_2$ is applied between the first and second electrodes, wherein the difference between the first and second total capacitances, ($C_{T2}-C_{T1}$), is a function of the capacitance $C_2$ between the conducting region and the floating first gate. The variable capacitor may further include a charge injector electrically coupled to the variable capacitor floating first gate, wherein the charge injector injects charge onto the variable capacitor floating gate. In some configurations, the charge injector further comprises: an island of semiconductor material on an insulating substrate wherein the island of semiconductor material further comprises: a first region and a second region of a first conductivity type separated by a channel region positioned between the first and second regions; and a third region of a second conductivity type which is adjacent to the channel region; and a charge injector floating gate positioned over the channel region wherein the charge injector floating gate is electrically coupled to the variable capacitor floating first gate and injects charge onto the variable capacitor floating gate. In some configurations, the variable capacitor exhibits: a first total capacitance $C_{T1}$ when a voltage $V_1$ is applied between the first and second electrodes and a second total capacitance $C_{T2}$ when a voltage $V_2$ is applied between the first and second electrodes; and a midpoint capacitance between capacitance $C_{T1}$ and capacitance $C_{T2}$ at a midpoint voltage $V_{MID}$ between voltage $V_1$ and voltage $V_2$, wherein the value of the midpoint voltage $V_{MID}$ is a function of the charge injected onto the variable capacitor floating gate from the charge injector.

In a second aspect, the present invention is a variable MOS capacitor comprising: a first semiconductive region; a first electrode electrically coupled to the first semiconductive region; a first gate which is electrically floating and is capacitively coupled to the first semiconductive region, wherein a capacitance $C_1$ represents the capacitive coupling between the floating first gate and the first semiconductive region; a conducting region capacitively coupled to the floating first gate, wherein a capacitance $C_2$ represents the capacitive coupling between the conducting region and the floating first gate; a second electrode electrically coupled to the conducting region; and a charge injector electrically coupled to the floating first gate for injecting charge onto the floating first gate. This variable MOS capacitor may further comprise an insulating substrate, wherein the first semiconductive region is formed on the insulating substrate. In some configurations, the insulating substrate further comprises sapphire. Some configurations of the variable MOS capacitor further comprise a second semiconductive region wherein the first semiconductive region is electrically coupled to the second semiconductive region which is electrically coupled to the first electrode. In some configurations, the first semiconductive region further comprises an N type semiconductor and the second semiconductive region further comprises an $N^+$ type semiconductor.

In a third aspect, the present invention is a programmable MOS capacitor comprising: a first semiconductive region; an electrical contact in electrical contact with the first semiconductor region; a first gate which is electrically floating and is capacitively coupled to the first semiconductive region, wherein the first floating gate overlaps at least a portion of the first semiconductive region thereby enabling a depletion capacitance to be formed in the first semiconductive region; a first insulating region positioned between the first semiconductive region and the first floating gate; a conducting region capacitively coupled to the floating first gate; and a charge injector electrically coupled to the floating first gate for injecting charge onto the floating first gate. In some configurations, the programmable MOS capacitor further comprises an insulating substrate, wherein the first semiconductive region is formed on the insulating substrate. In some configurations, the insulating substrate further comprises sapphire. In some configurations, the programmable MOS capacitor further comprising a second semiconductive region wherein the first semiconductive region is electrically coupled to the second semiconductive region which is electrically coupled to the electrical contact. In some configurations, the first semiconductive region further comprises an N type semiconductor and the second semiconductive region further comprises an N+ type semiconductor.

In a fourth aspect, the present invention is a MOS capacitor comprising: a floating gate which overlaps at least a portion of a first semiconductive region wherein a depletion region is formed; and a charge injector electrically coupled to the floating gate for injecting charge onto the floating gate. The MOS capacitor may further comprise an insulating substrate, wherein the first semiconductive region is formed on the insulating substrate. In some configurations, the insulating substrate further comprises sapphire. In some configurations, the MOS capacitor further comprises a second semiconductive region wherein the first semiconductive region is electrically coupled to the second semiconductive region. In some configurations, the first semiconductive region further comprises an N type semiconductor and the second semiconductive region further comprises an N+ type semiconductor.

In a fifth aspect, the present invention is a method for modifying a C-V plot which is characteristic of a variable MOS capacitor comprising injecting charge onto a floating gate which overlaps at least a portion of a semiconductive region of the MOS capacitor wherein a depletion region is formed.

These and other desirable characteristics are embodied in the present invention and will become apparent through reference to the following detailed description of the preferred embodiments and accompanying drawings.

BRIEF DESCRIPTION OF THE DRAWINGS

FIG. 4A shows a top view of an alternate embodiment of a varactor cell with a multi-fingered or comb shaped floating gate.

FIG. 6C shows a top view of a charge injector/storage cell (EEPROM) including a centered Channel Hot Electron (CHE) injector hole.

FIG. 6D shows a cross sectional view (through the center and along the N-channel) of the injector/storage cell (EEPROM) with the centered CHE injector shown in FIG. 6C.

Figure 1:
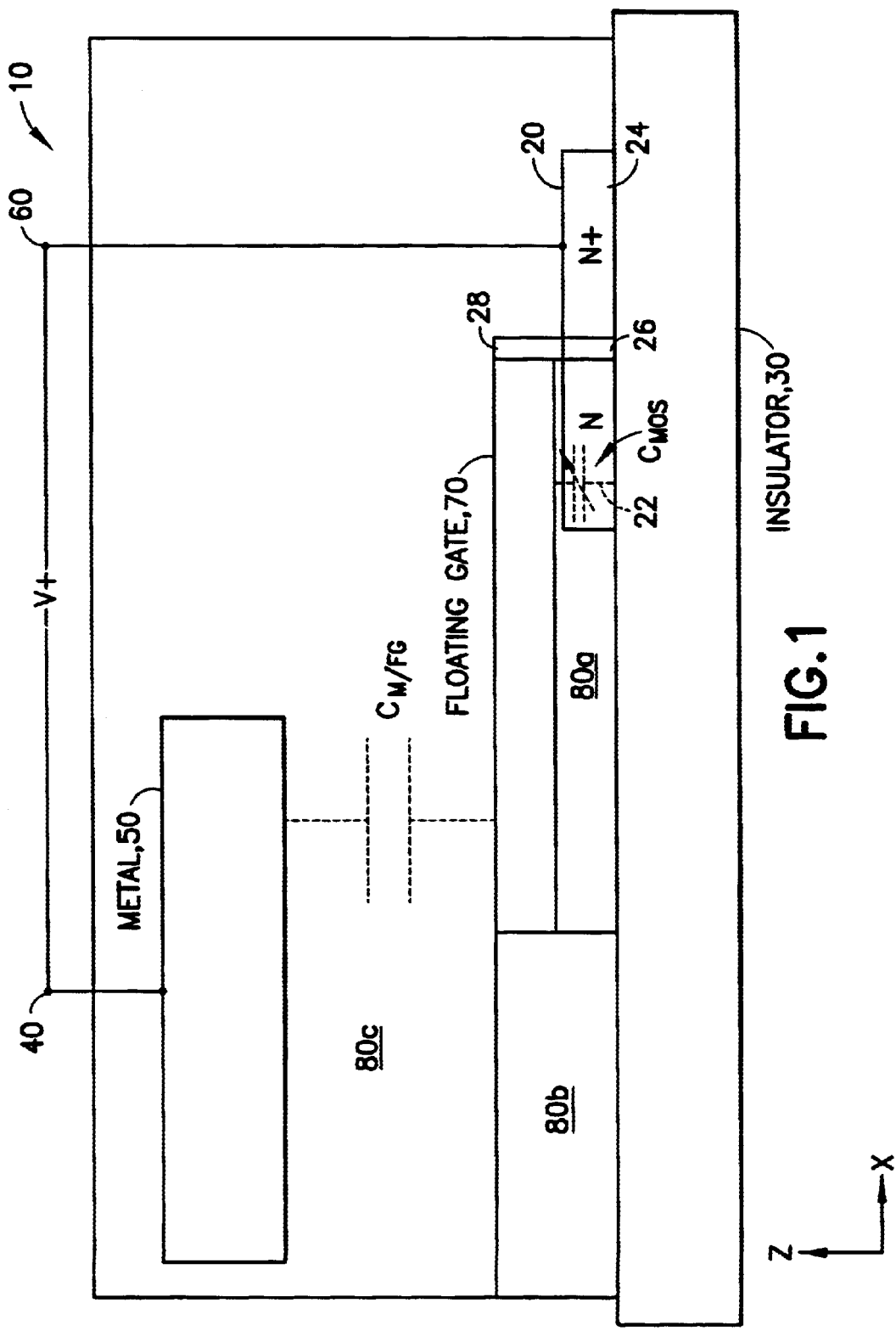
FIG. 1 shows a diagrammatic cross section view of a basic varactor cell in accordance with the present invention.

| Reference Numerals in Drawings | |
|---|---|
| 10 | varactor |
| 20 | layer of silicon |
| 22 | N region |
| 24 | N+ region |
| 26 | lightly doped drain (LDD) region |
| 28 | sidewall spacer |
| 30 | insulating substrate |
| 40 | first varactor terminal |
|    | metal gate contact |
| 50 | conducting or metal region |
|    | metal gate |
| 60 | second varactor terminal |

-continued

Reference Numerals in Drawings

| | |
|---|---|
| 70 | floating gate |
| | floating polysilicon gate |
| 80a | insulating layer |
| | gate oxide layer |
| 80b | insulating layer |
| 80c | insulating layer |
| 90 | floating gate fingers |
| 92 | negative charge |
| 94 | transistor |
| | pass transistor |
| 96a | source/drain connection |
| 96b | source/drain connection |
| 96c | gate connection |
| 102 | solid C-V plot |
| 104 | dotted C-V plot |
| 106 | dashed C-V plot |
| 110 | charge injection device |
| | charge injector |
| | basic storage cell |
| | structure |
| | device |
| | EEPROM cell |
| 120 | island of silicon |
| 130 | insulating substrate |
| | e.g. sapphire or silicon dioxide |
| 130 | substrate |
| | SOI substrate |
| | insulating layer |
| 124 | gate oxide |
| 140 | floating gate |
| 150 | Lightly Doped Drain (LDD) |
| | implants |
| 160 | sidewall spacers |
| 170 | N + region, |
| | N-channel device |
| | MOS transistor |
| | N+ Source/Drain regions |
| 170D | drain |
| 170S | source |
| 180 | P + region, |
| | P-channel device |
| | MOS transistor |
| | P+ Source/Drain regions |
| 200 | charge injection device |
| | charge injector |
| | alternate structure |
| | cell |
| | device |
| 210 | injector region |
| | injector |
| 222 | channel |
| | silicon channel |
| 240 | electron-based leakage current |
| 242e | electron (from pair) |
| 242h | hole (from pair) |
| 250 | silicon-insulator interface |
| 270 | N+ region |
| 280 | P+ region |
| 270, 280 | PN diode |
| 290e | electron |
| 290h | hole |

DETAILED DESCRIPTION OF THE INVENTION

Basic Varactor Cell

Figure 2:
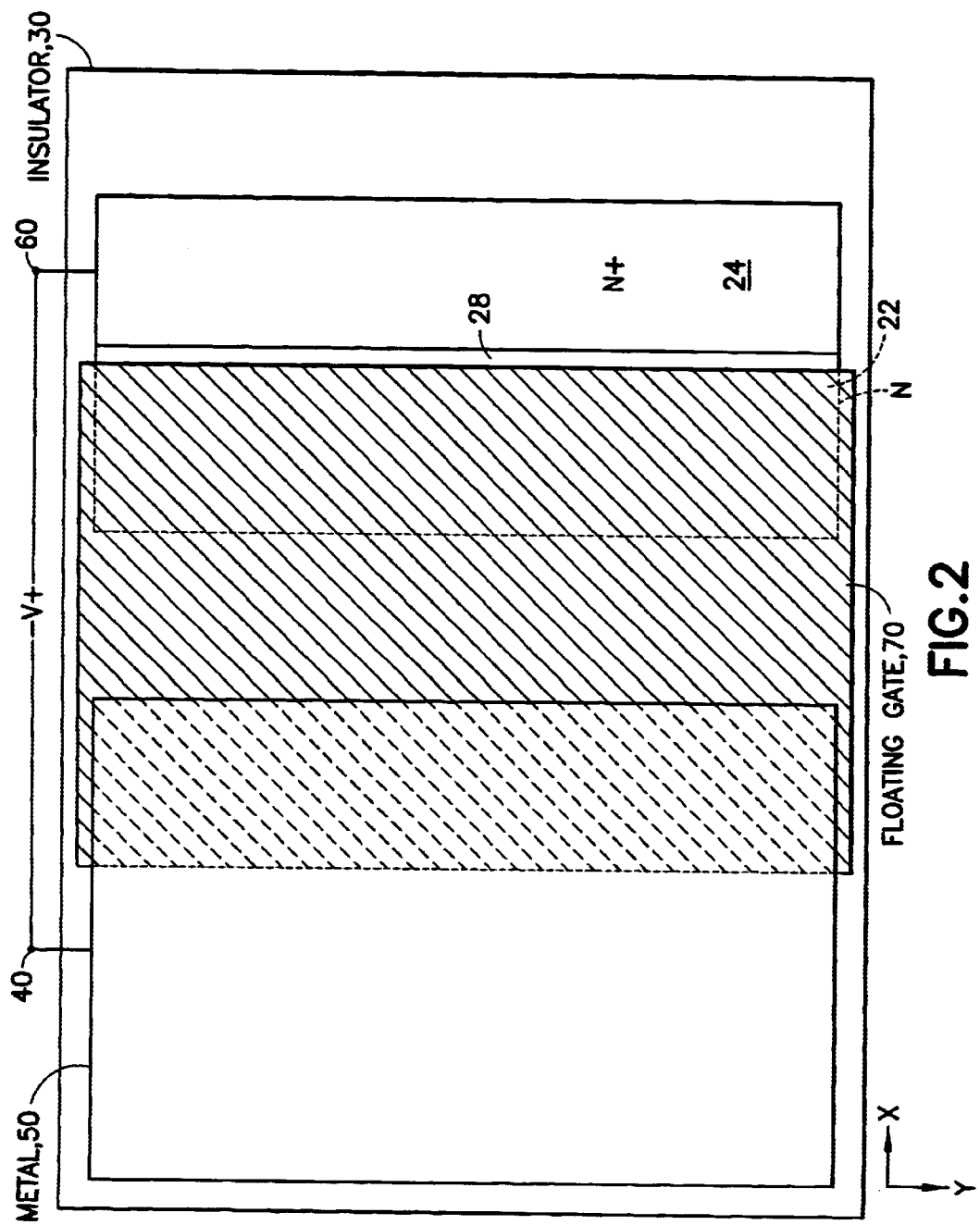
FIG. 2 shows a top view of the basic varactor cell shown in FIG. 1.

FIG. 1 shows a diagrammatic cross section of a basic varactor 10 in accordance with the present invention. FIG. 2 shows a top view of the basic varactor 10 illustrated in FIG. 1. Varactor 10 is fabricated in a layer of silicon (Si) 20 on an insulating substrate 30, e.g. sapphire. An N or N⁻ region 22 and an N⁺ region 24 are formed in the silicon layer 20. A lightly doped drain region 26 is formed between the N region 22 and the N⁺ region 24. A sidewall spacer 28 is formed adjacent the lightly doped drain region 26 and a floating gate 70. A portion of the floating gate 70 overlaps a portion of N region 22. Insulating layers 80a, 80b and 80c are formed between various components of the varactor 10 structure. A first portion of insulating layer 80a separates the floating gate 70 from the insulating substrate 30. A second portion of the insulating layer 80a is adjacent to both the floating gate 70 and the N region 22. This second portion of the insulating layer 80a may also be referred to as a gate oxide layer. A first varactor terminal 40 makes electrical contact with a conducting or metal region 50. A second varactor terminal 60 makes electrical contact with the N⁺ region 24. Thus, the second varactor terminal 60 is electrically coupled to the N region 22 through the N⁺ region 24 and the lightly doped drain region 26. The widespread use of this type of structure for MOS devices facilitates implementation of the present invention. However, the present invention could also be practiced without using all of the above described features. For example, the sidewall spacer 28 and the lightly doped drain region 26 may be eliminated in alternative configurations.

In operation of the varactor 10, a variable depletion capacitance, $C_{DEP}$, is created between the floating gate 70 and the underlying N region 22, which is separated from the floating gate 70 by the thin gate oxide layer 80a. As shown schematically in FIG. 3, the total capacitance of varactor 10 is a series capacitance comprising: a) a capacitance between the metal 50 and the floating gate 70, referred to as $C_{M/FG}$; and b) a MOS gate capacitance between the floating gate 70 and the N/N+ regions 22, 24, referred to as $C_{MOS}$. The MOS gate capacitance, $C_{MOS}$, is the series capacitance of $C_{OX}$ and $C_{DEP}$, where $C_{OX}$ is the capacitance due to the gate oxide 80a and $C_{DEP}$ is the depletion capacitance of the N region 22. Phantom line capacitor symbols representing the capacitances $C_{M/FG}$ and $C_{MOS}$ are shown in FIG. 1.

While the above description refers to varactor 10 formed on insulating substrate 30, similar performance results may also be achieved in a similar structure using a Si substrate, an embodiment which is to be understood as being included within the scope of the present invention. Additionally, while the structure shown in FIG. 1 is an N-type version of varactor 10, it is to be understood that a P-type version is also included within the scope of the present invention.

Several features of the structure shown in FIG. 1 contribute to its function as a varactor 10. The use of a floating polysilicon gate 70 permits use of the MOS gate capacitance, $C_{MOS}$, as the variable capacitor. In a typical MOS device, the gate-channel capacitance undergoes a large change in response to a small voltage (often a capacitance change of 5:1 in less than 1 V). A change in capacitance of this magnitude in response to such a small change in voltage is relatively unusable for a varactor since it leads to a very high gain and therefore noisy VCO. In the varactor 10 of the present invention as shown in FIGS. 1 and 2, the capacitance $C_{M/FG}$ between the metal 50 and the floating gate 70 can be designed to reduce the total capacitance variation of the varactor 10 and increase the voltage swing between maximum and minimum capacitance to any desired value (also called the tuning range). Additionally, the floating gate 70 of varactor 10, makes it possible to inject charge onto the floating gate 70 and thus change the center of the tuning voltage range of varactor 10 (as seen by the metal gate contact 40). An additional benefit offered by varactor 10 is that the overlap region between the floating gate 70 and the N region 22 can be kept to a minimum length. Since the dominant resistance in varactors is typically due to the semiconductor region under the depletion capacitance, keeping this region as short as possible results in higher Q values. Prior varactor devices, such as P-I-N diodes, use a relatively high-resistivity semiconductor region that is typically 1–5 micrometers long and in series with the variable capacitor. In the current invention the high-resistivity region (the N region 22 in FIGS. 1 and 2) can be much less than 1 micron long, thereby minimizing the largest contributor to series resistance in the varactor. Presently, a primary limitation on the minimum length of the N region 22 (i.e., the x dimension as shown in FIGS. 1 and 2) is the alignment accuracy of the fabrication process, which is often only a few tenths of micrometers or less. Thus, using presently available fabrication technologies, varactor 10 can be fabricated with an N region 22 having a length of less than approximately 0.5 micron.

The general structure of varactor 10 as shown in FIGS. 1 and 2 permits for designs of varactors of virtually any capacitance and tuning range, the voltage over which the capacitor changes from its maximum to minimum value is referred to as the "tuning range", $V_R$, of the varactor 10. The ratio of the maximum capacitance to the minimum capacitance of the varactor 10 over the tuning range may also be referred to as the "capacitance ratio", $C_R$, of the varactor 10. The capacitance values of varactor 10 are proportional to the width of the device (i.e., the y dimension as shown in FIG. 2). The capacitance ratio and tuning range of varactor 10 are adjusted by controlling the ratio of the area of overlap between the metal 50 and the floating gate 70 relative to the area of overlap between the floating gate 70 and the N region 22.

Figure 3:
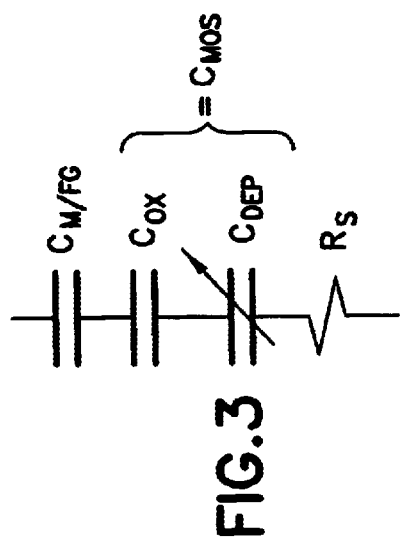
FIG. 3 shows an equivalent electrical circuit of capacitance and resistance for the varactor cell illustrated in FIGS. 1 and 2.

An equivalent electrical circuit of capacitance and resistance of varactor 10 is shown in FIG. 3. As previously discussed in reference to FIGS. 1 and 2, $C_{M/FG}$ is the capacitance from the metal 50 to the floating gate 70. The capacitance due to the gate oxide 80a is $C_{OX}$ and the depletion capacitance of the P region 22 is $C_{DEP}$. The series resistance of the device 10 (primarily the sum of the resistances of the N region 22, the LDD region 26, the N+ region 24, the contacts 40,60 and the metal 50) is $R_S$. As shown in FIG. 3, the series capacitance of $C_{OX}$ and $C_{DEP}$ is referred to as $C_{MOS}$. The total capacitance $C_V$ of varactor 10 as shown in the equivalent circuit of FIG. 3, is given by:

$$C_V = \frac{(C_{M/FG})(C_{MOS})}{(C_{M/FG} + C_{MOS})} \quad (1)$$

The capacitance ratio, $C_R$, of the varactor 10 is less than the capacitance ratio for its MOS capacitor component or a similar isolated MOS capacitor. This decrease in the capacitance ratio, $C_R$, for varactor 10 as compared with its MOS capacitor component is linked with an increase in the voltage tuning range, $V_R$, for the varactor 10 as compared with the tuning range of its MOS capacitor component. The changes in both $C_R$ and $V_R$ are approximated by the ratio or inverse ratio of the MOS capacitance component, $C_{MOS}$, of the total capacitance, $C_V$, of varactor 10 to the total capacitance, $C_V$, of varactor 10 as follows:

$$\frac{C_{MOS}}{C_V} = \frac{(C_{M/FG} + C_{MOS})}{(C_{M/FG})} \quad (2)$$

These changes in the capacitance ratio, $C_R$, and the voltage tuning range, $V_R$, for the varactor 10 made in accordance with the present invention as compared with a typical MOS capacitor are illustrated by the following specific example.

For typical Si MOS capacitors, the normal tuning range is approximately 1 Volt with a capacitance ratio of approximately 5:1. For purposes of illustration, consider a specific embodiment of the varactor 10 wherein: 1) $C_{OX}$ is selected to be approximately 10 times larger than $C_{M/FG}$; 2) the gate oxide thickness 80a is selected to be approximately 100 Angstroms; and 3) the N region 22 is doped to about $7 \times 10^{17}$ cm$^{-3}$. This results in a tuning range for varactor 10 of about 10 Volts and a maximum to minimum capacitance ratio of approximately 2:1. The total capacitance is determined by the width (y dimension in FIGS. 1 and 2) of the device.

Varactors 10 made in accordance with the present invention result in very high Q devices since the total varactor capacitance is determined by the width of the device along with the overlap of metal 50 to floating gate 70, while the series resistance (and hence Q) is set by the overlap of the floating gate 70 to the N region 22. Additionally, by adjusting the layout of varactor 10, tradeoffs can be made between the size of the capacitance, the Q of the device, and the tuning range. Hence, the present invention gives the user and designer the freedom to construct a desired varactor with a higher Q value than heretofore possible.

Figure 4B:
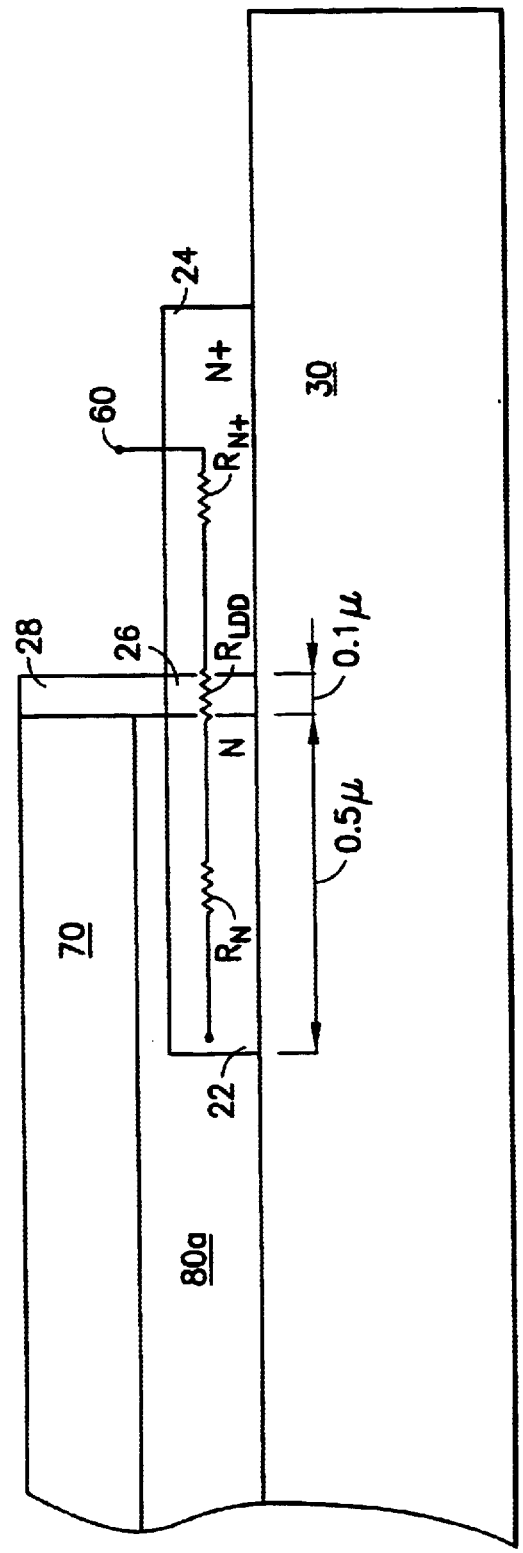
FIG. 4B is a cross section of the basic varactor 10 shown in FIG. 1 illustrating resistive components which contribute to the total series resistance of the varactor.

FIG. 4A shows an example of an alternative layout of a varactor which incorporates features of the present invention wherein the floating gate region 70 that overlaps the N or N$^-$ silicon region 22 is arranged in fingers 90. This design, which reduces the series resistance in the N region by approximately 50% by reducing the maximum distance from the N$^+$ to the N$^-$ region under the floating gate to half the value as that for the varactor design shown in FIG. 1, results in a higher Q device. The following comparison of the two specific configurations shown in FIGS. 4B, 4C and 4D illustrates one way in which the series resistance can be reduced.

Figure 4C:
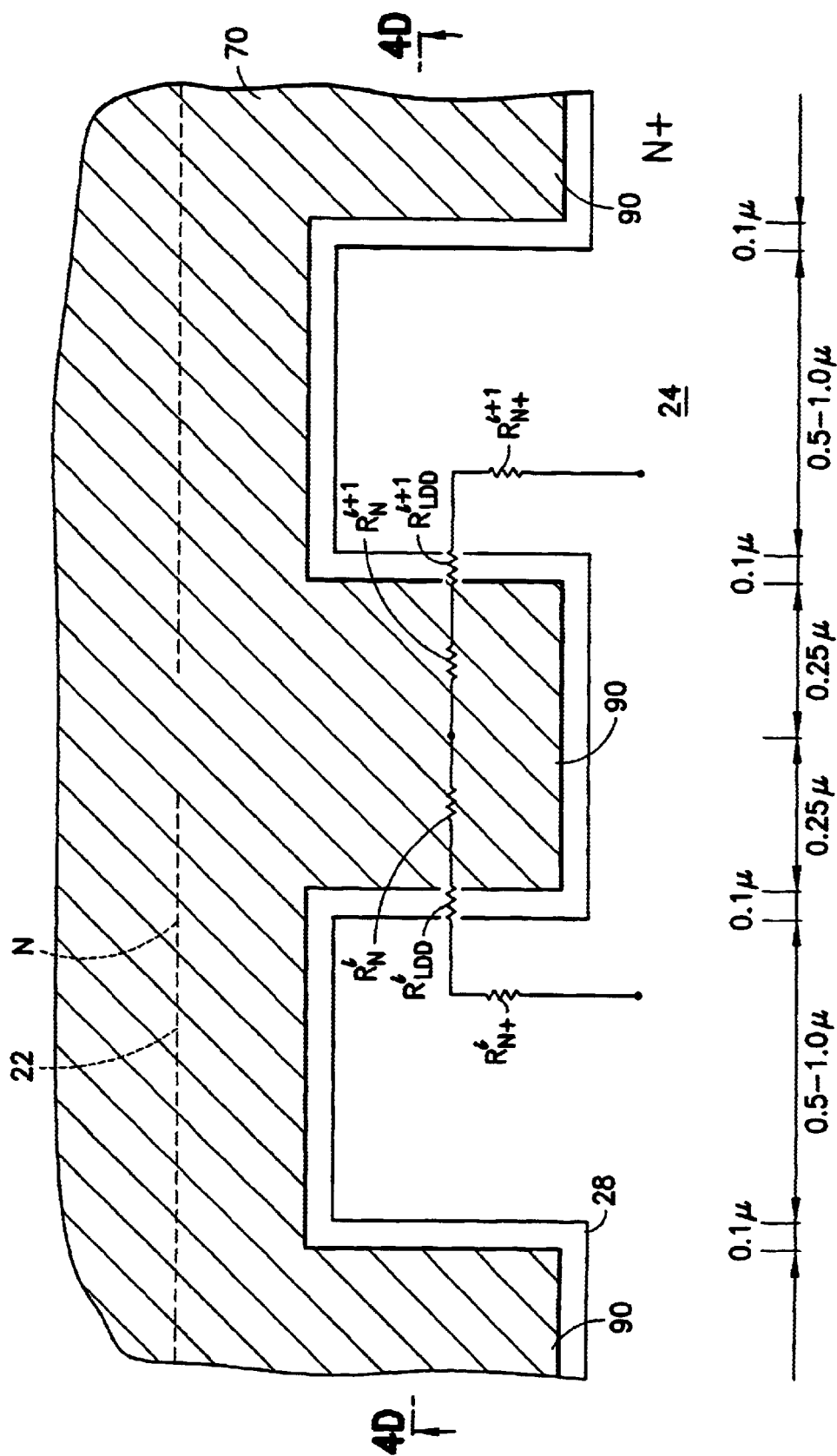
FIG. 4C is an enlarged top view of a specific varactor design configuration based on the general varactor design shown in FIG. 4A illustrating resistive components which contribute to the total series resistance of the varactor.
Figure 4D:
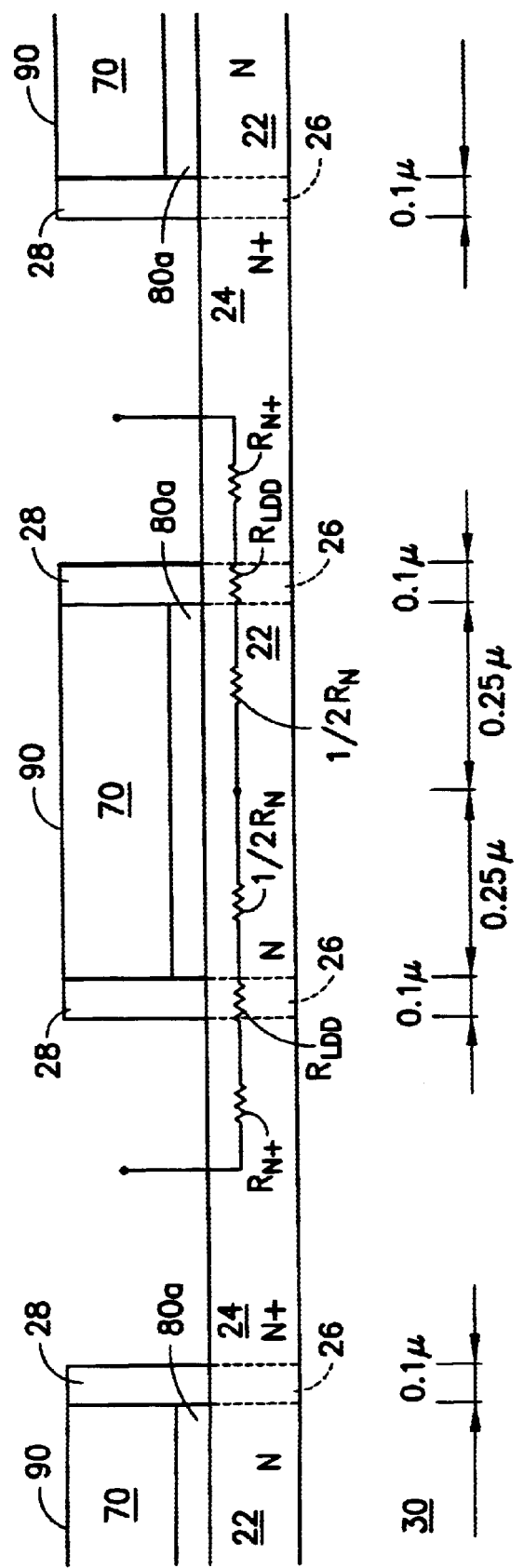
FIG. 4D is a cross section view of the specific varactor design configuration shown in FIG. 4C.

The specific configurations of varactor designs with and without the fingers 90 shown in FIGS. 4B, 4C and 4D illustrate how this approximately 50% reduction in series resistance occurs in the design with the fingers as compared to the design without the fingers. FIG. 4B illustrates a cross section of the basic varactor 10 shown in FIG. 1 where the length of the N region 22 under the floating gate 70 is selected to be approximately 0.5 microns and the length of the LDD region 26 which separates the N region 22 from the N$^+$ region 24 is selected to be approximately 0.1 microns. Thus, the series resistance $R_S$ of this varactor design is approximately equal to the following sum:

$$R_S = R_N + R_{LDD} + R_{N^+} \quad (3)$$

where $R_N$ is the resistance through the entire length of the N region 22 (approximately 0.5 microns in this example), $R_{LDD}$ is the resistance through the length of the LDD region 26 (approximately 0.1 microns in this example), and $R_{N+}$ is the resistance through the N$^+$ region 24 from the LDD region to the contact 60. For purposes of this illustration, the resistances $R_N$, $R_{LDD}$ and $R_{N+}$ are normalized such that $R_N \approx 100$ (distance to the farthest point is approximately 0.5 microns in this example), $R_{LDD} \approx 1$ and $R_{N+}=1$. As seen from this example, since N type material is typically several orders of magnitude more resistive than N$^+$ type material, the resistance in the N type portion 22 of the varactor dominates the total resistance and therefore also dominates the Q of the varactor.

FIGS. 4C and 4D illustrate an enlarged top view and an enlarged cross section view, respectively, of a specific varactor design configuration based on the general varactor design shown in FIG. 4A wherein the floating gate region 70 that overlaps the N silicon region 22 is arranged in fingers 90. In the specific varactor design configuration shown in FIGS. 4C and 4D, the fingers 90 of the floating gate 70 and the N regions 22 under the fingers 90 have a width under the floating gate 70 which is selected to be approximately 0.5 microns and the thickness of the LDD region 26 which separates the N region 22 from the N+ region 24 is selected to be approximately 0.1 microns. As shown in FIGS. 4C and 4D, a series resistance component $R_S^i$ is approximately equal to the following sum:

$$R_S^i = R_N^i + R_{LDD}^i + R_{N+}^i \quad (4)$$

where $R_N^i$ is the resistance through half (½) the width of the N region 22 portion of the finger 90 (approximately 0.25 microns in this example), $R_{LDD}^i$ is the resistance through the thickness of the LDD region 26 (approximately 0.1 microns in this example), and $R_{N+}^i$ is the resistance through the N+ region 24 from the LDD region. Referring to FIG. 4C, resistance component $R_S^i$ is parallel to resistance component $R_S^{i+1}$. Using the same normalization as used above for the non-fingered configuration (FIG. 4B), the fingered configuration (FIGS. 4C and 4D) resistances $R_N$, $R_{LDD}$ and $R_{N+}$ are normalized such that $R_N \approx 50$ (distance to the farthest point is approximately 0.25 microns in this example), $R_{LDD} \approx 1$ and $R_{N+} = 1$. Thus, as compared to the non-fingered configuration (FIG. 4B), the series resistance in the N region of the fingered configuration (FIGS. 4C and 4D) is reduced by approximately 50%. Additionally, since the series resistance of the fingered configuration (FIGS. 4C and 4D) is half (½) the series resistance of the non-fingered configuration (FIG. 4B), the Q of the fingered configuration is double (×2) that of the non-fingered configuration.

Obviously, many other layouts for varactor 10 incorporating the features discussed above can be considered, including but not limited to the use of additional metal layers, different doping and different shapes of all regions. It should be understood that all such alternate layouts and embodiments are intended to be included within the scope of the present invention.

Tunable Varactor

Figure 5:
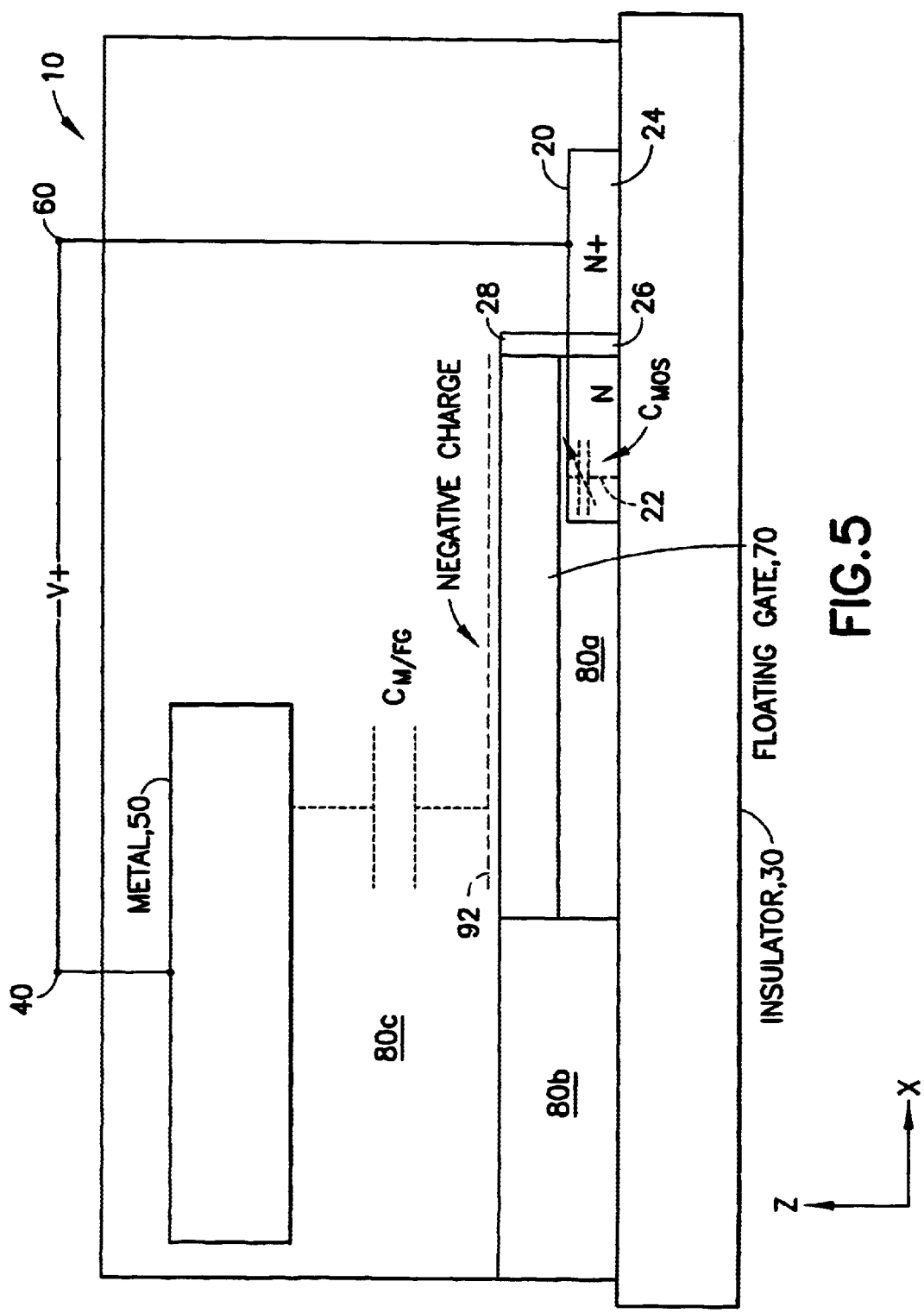
FIG. 5 shows how the basic varactor cell of the present invention may be tuned by injecting charge on the floating gate.
Figure 5A:
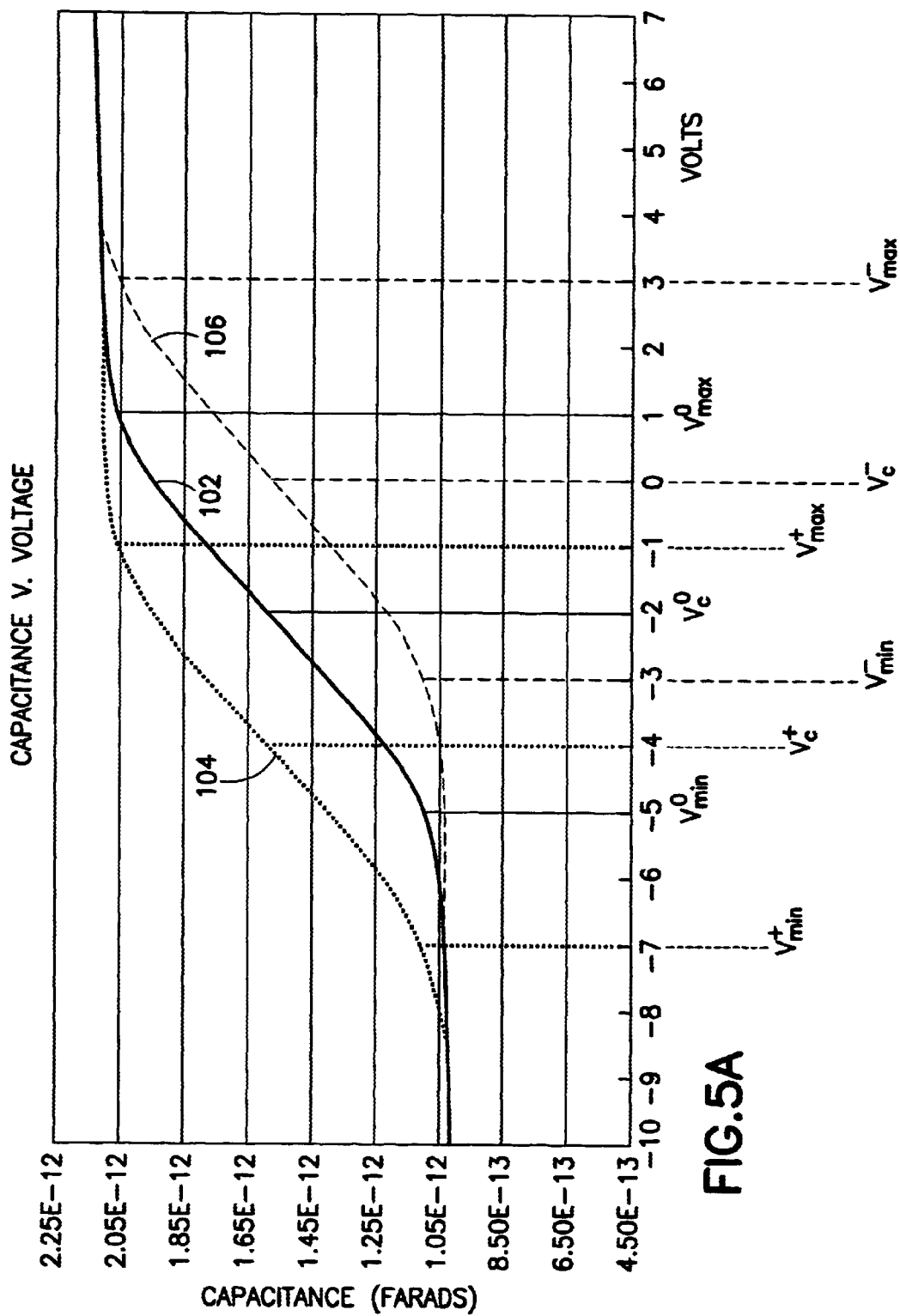
FIG. 5A is a capacitance-voltage (C-V) plot typical of the varactor of the present invention.

The device shown in FIGS. 1 and 2 also enables adjustment of the capacitance vs. voltage (C-V) relationship of the varactor 10 as shown in C-V plots 102, 104, 106 in FIG. 5A. This is accomplished by considering the condition shown in FIG. 5, in which negative charge 92 has been injected onto the floating gate 70. The negative charge 92 offsets the C-V relationship between the metal layer 50 and the N+ region 24 by forcing the metal layer 50 to be more positive to offset the negative charge 92 on the floating gate 70. The magnitude of this effect is controlled by standard voltage division calculations of the capacitors, $C_{M/FG}$, $C_{OX}$ and $C_{DEP}$. Similarly, the injection of positive charge onto the floating gate 70 offsets the C-V relationship between the metal layer 50 and the N+ region 24 by forcing the metal layer 50 to be more negative to offset the positive charge injected on the floating gate 70.

This shift in the C-V plot is illustrated by the specific examples plotted in FIG. 5A. The solid curve 102 in FIG. 5A is a C-V plot typical of the varactor of the present invention. The solid curve 102 represents a varactor configuration having the following characteristics: a) a minimum capacitance between the metal region 50 and the N+ region 24 (contact 40 and contact 60, respectively in FIG. 5) of approximately 1 pF when a voltage $V_{MIN}^o = -5$ volts, is applied between the metal region 50 and the N+ region 24; b) a maximum capacitance of a little more than 2 pF when a voltage $V_{MAX}^o = 1$ volt is applied between the metal region 50 and the N+ region 24; c) a voltage tuning range of $V_{MAX}^o - V_{MIN}^o = 6$ volts centered about $V_C^o = -2$ volts; and d) a capacitance ratio of 2:1. The dotted curve 104 represents a varactor configuration where a positive charge, q, has been injected onto the floating gate 70 of the varactor. The dotted curve 104 shows the following characteristics for this configuration: a) a minimum capacitance between the metal region 50 and the N+ region 24 (contact 40 and contact 60, respectively in FIG. 5) of approximately 1 pF when a voltage $V_{MIN}^+ = -7$ volts, is applied between the metal region 50 and the N+ region 24; b) a maximum capacitance of a little more than 2 pF when a voltage $V_{MAX}^+ = -1$ volt, is applied between the metal region 50 and the N+ region 24; c) a voltage tuning range of $V_{MAX}^+ - V_{MIN}^+ = 6$ volts centered about $V_C^+ = -4$ volts; and d) a capacitance ratio of 2:1. The dashed curve 106 represents a varactor configuration where a negative charge, -q, has been injected onto the floating gate 70 of the varactor. The dashed curve 106 shows the following characteristics for this configuration: a) a minimum capacitance between the metal region 50 and the N+ region 24 (contact 40 and contact 60, respectively in FIG. 5) of approximately 1 pF when a voltage $V_{MIN}^- = -3$ volts, is applied between the metal region 50 and the N+ region 24; b) a maximum capacitance of a little more than 2 pF when a voltage $V_{MAX}^- = 3$ volt, is applied between the metal region 50 and the N+ region 24; c) a voltage tuning range of $V_{MAX}^- - V_{MIN}^- = 6$ volts centered about $V_C^- = 0$ volts; and d) a capacitance ratio of 2:1. In summary, the injection of positive charge onto the floating gate 70 shifts the solid curve 102 to the left (dotted curve 104) and the injection of negative charge onto the floating gate 70 shifts the solid curve 102 to the right (dashed curve 106). The magnitude of these shifts is approximately equal to $q/C_{M/FG}$.

The above described charge injection mechanism provides for an electrically tunable varactor. For example, if a certain capacitance is desired over a 0-3 V tuning range, charge injection can be used to adjust the C-V plot positively or negatively until the desired center value is achieved. Thus, charge injection provides an electrical mechanism to provide frequency offset tuning. This type of tuning can also be used to compensate for manufacturing tolerances or to provide multi-band operation with a single device.

Figure 6A:
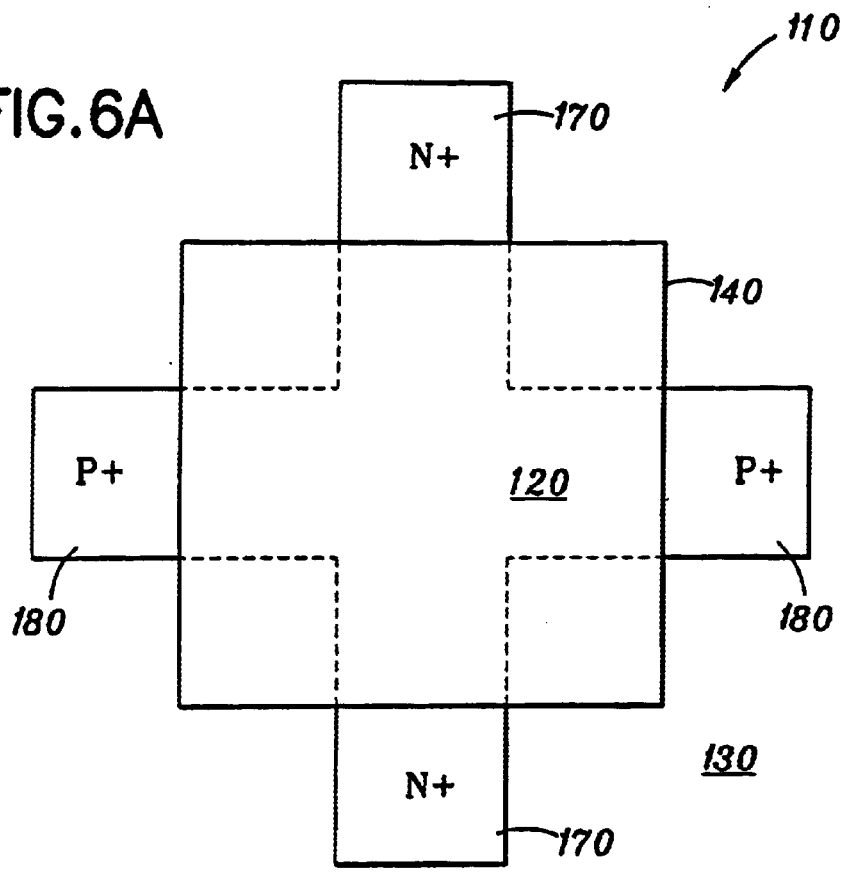
FIG. 6A shows a top view of a basic charge injector/storage cell used for injecting charge onto the floating gate of the basic varactor cell of the present invention. The basic charge injector/storage cell may also be configured as an Electrically Erasable PROM, i.e., EEPROM or $E^2$PROM.

Two examples of charge injection devices 110,200 which may be utilized to inject negative or positive charge onto the floating gate 70 of varactor 10 are shown in FIGS. 6A, 6B, 6C and 6D. The charge injectors 110,200, and further applications utilizing their features, are described in detail in commonly assigned U.S. patent application Ser. No. 09/420, 952; filed on Oct. 19, 1999; by inventors Ronald E. Reedy and James S. Cable; and entitled "An EEPROM Cell on SOI". This application has previously been incorporated herein by reference. In general, the charge injectors 110,200 inject either holes or electrons onto a charge injector 110,200 floating gate 140 when a voltage is applied to either N+ or P+ regions 170,180, respectively, as shown in FIG. 7A for N+ regions 170. When a bias is applied to the P+ regions 180, electrons are injected onto the floating gate 140. When the floating gate 140 of the charge injector 110,200 (FIGS. 6A, 6B, 6C, 6D, 7A and 7B) is attached to the floating gate 70 (FIGS. 1, 2, 4 and 5) of the varactor 10, the charge on the floating gate 140 of the charge injector 110,200 will be shared equally with the floating gate 70 of the varactor 10, hence adding charge of either polarity to the floating gate 70 of the varactor 10.

A first alternative for transferring charge between the floating gate 140 of the charge injector 110,200 and the gate 70 of the varactor 10 is to permanently attach the two floating gates 70,140 to each other. One way to accomplish this permanent attachment is to pattern both gates 70,140 from a single piece of polysilicon. Voltage offset control of the varactor 10 may then be provided by controlling the time and level of the voltage pulses applied to the appropriate nodes 170,180 of the charge injector 110,200.

Figure 8:
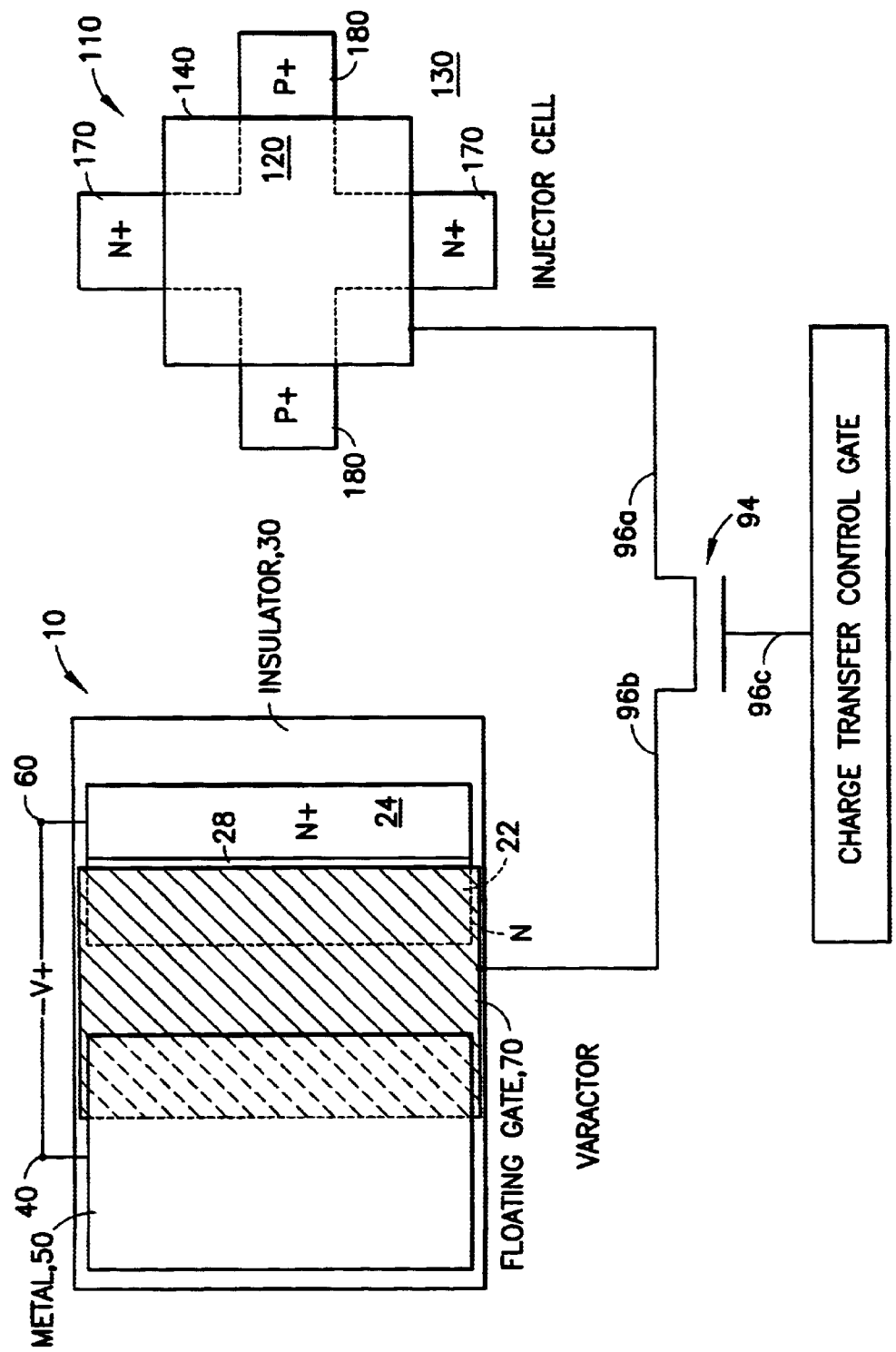
FIG. 8 shows a varactor tuning circuit comprising the basic varactor cell connected to the basic charge injector/storage cell for injecting charge onto the floating gate of the varactor cell.

A second alternative for transferring charge between the floating gate 140 of the charge injector 110,200 and the floating gate 70 of the varactor 10 is shown schematically in FIG. 8. A transistor 94 having a first source/drain (S/D) connection 96a, a second source/drain (S/D) connection 96b, and a gate connection 96c is connected between the floating gate 140 of the charge injector 110 and the floating gate 70 of the varactor 10. As shown in FIG. 8, the first source/drain (S/D) connection 96a is connected to the floating gate 140 of the charge injector 110 and the second source/drain (S/D) connection 96b is connected to the floating gate 70 of the varactor 10. The gate 96c of the transistor 94 is attached to a control voltage line.

In one mode of operation, the pass transistor 94 is "OFF" while the floating gate 140 of the charge injector 110 is charged. The pass transistor 94 is then biased into the "ON" condition by applying an appropriate voltage (i.e., greater than the threshold voltage of the pass transistor 94) to the pass transistor 94 gate connection 96c. When the transistor 94 is "ON", the charge accumulated on the floating gate 140 of the charge injector 110 is distributed equally with any charge on the floating gate 70 of the varactor 10. When the transistor 94 is "OFF", the floating gate 70 of the varactor 10 is decoupled from the floating gate 140 of the charge injector 110. Thus, repeated cycles of charging the floating gate 140 of the charge injector 110 while the transistor 94 is "OFF"; followed by distributing/sharing this charge with the floating gate 70 of the varactor 10 while the transistor 94 is "ON"; allows the charge on the floating gate 70 of the varactor 10 to be set to a predetermined level. Since the floating gate 70 of the varactor 10 is likely to be much larger than the floating gate 140 of the charge injector 110, each programming cycle increments the varactor voltage by a relatively small voltage, thereby allowing for very fine control of the voltage shift. Multiple cycles can be used to adjust the varactor offset voltage to any desired level. By injecting both holes and electrons, a completely fine tunable, high Q, high dynamic range varactor 10 is achieved. This high dynamic range varactor 10 is made entirely by using standard MOS processing steps. The electrical values and characteristics of this high dynamic range varactor 10 are controlled by the design and layout of the device.

Figure 9:
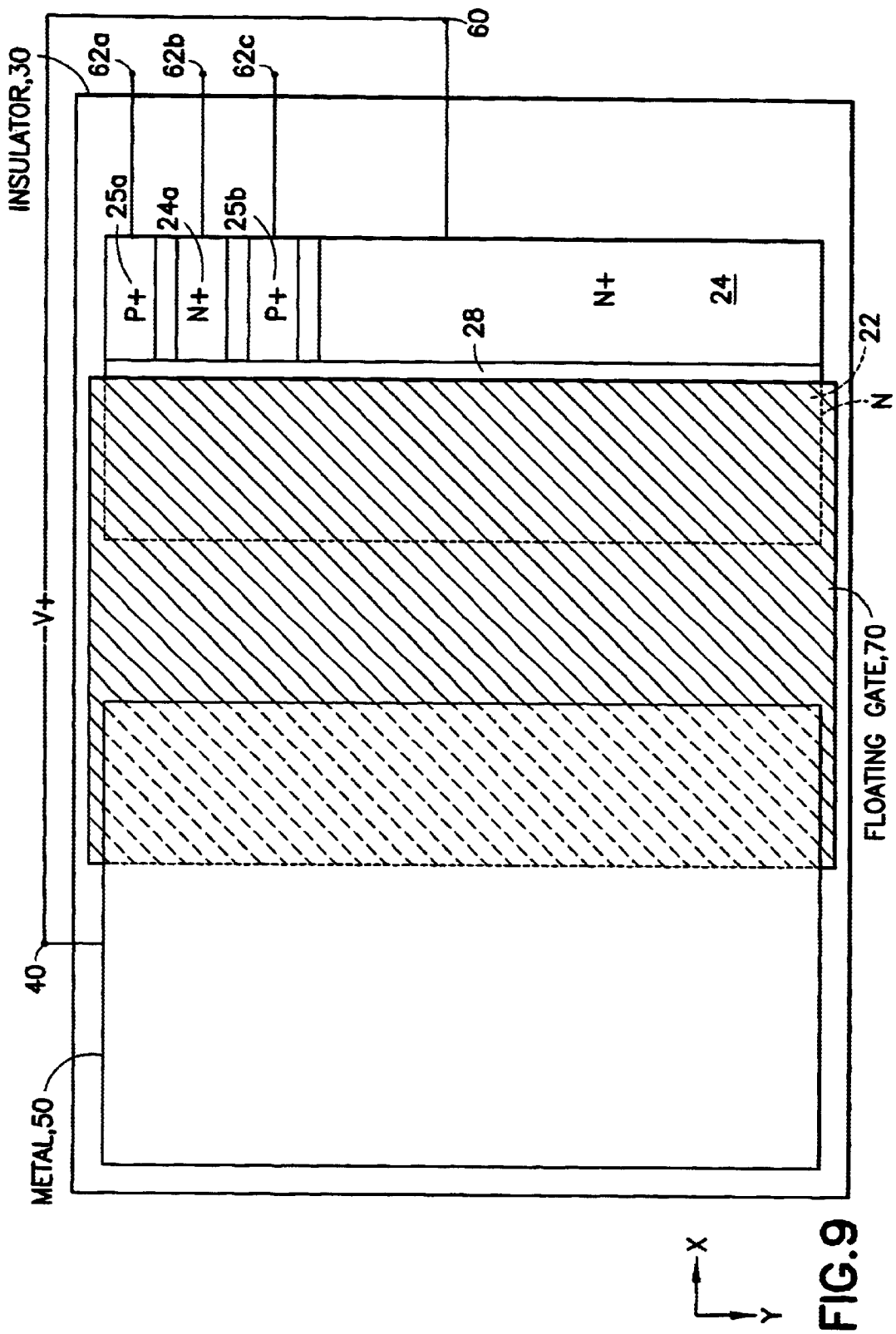
FIG. 9 shows an alternative varactor tuning structure configuration of the present invention wherein the charge injector cell is integrated directly with the varactor cell.

A third alternative for transferring charge from the charge injector to the floating gate 70 of the varactor 10 is shown in FIG. 9. In the embodiment shown in FIG. 9, an injector cell is integrated directly with the varactor by splitting the N+ region 24 of the varactor into N+ 24a and P+ regions 25a,25b with independent contacts 60,62a,62b,62c on each region, thereby allowing direct injection of charge onto floating gate 70. In this configuration, injection of positive charge onto the floating gate 70 is accomplished by applying a voltage between the two N+ regions 24a,24b thereby injecting holes onto the floating gate 70 thereby shifting the C-V plot negatively (see FIG. 5A). Injection of negative charge onto the floating gate 70 is accomplished by applying a voltage between the two P+ regions 25a,25b thereby injecting electrons onto the floating gate 70 thereby shifting the C-V plot positively (see FIG. 5A). See charge injector description herein for more detailed discussion of charge injection.

Charge Injector/Storage/EEPROM Cell

The charge injector/storage cell described below may also be configured as an Electrically Erasable PROM, called EEPROM or E$^2$PROM. As shown in FIGS. 6A (top view) and 6B (cross section view), the charge injector cell 110 comprises a single island of silicon 120 on an insulating substrate 130, for example sapphire or silicon dioxide. In all steps and layers defined below, the processing occurs during the standard CMOS process step, i.e., there are no steps or layers added to the standard CMOS flow. The silicon island 120 can be defined by either LOCal Oxidation of Silicon (LOCOS) or mesa isolation techniques. The aspect ratios and shape may be different than the detailed one shown, but a symmetric one is shown here for convenience of discussion.

The silicon island 120 may then receive a threshold adjust implant or it can remain intrinsic (i.e., no implant), as assumed in this discussion. Then a gate oxide 124 is grown and polysilicon is patterned as a floating gate 140. Either N+ or P+ polysilicon can be used and it can be silicided or not. In this case, it is assumed to be N+ polysilicon. Following polysilicon gate patterning, Lightly Doped Drain (LDD) implants 150 and sidewall spacers 160 are formed followed by N+ and P+ regions 170, 180, as shown. The device is contacted by aluminum metalization (not shown) at the N+ and P+ regions 170, 180. No contact is made to the floating gate 140.

Figure 6B:
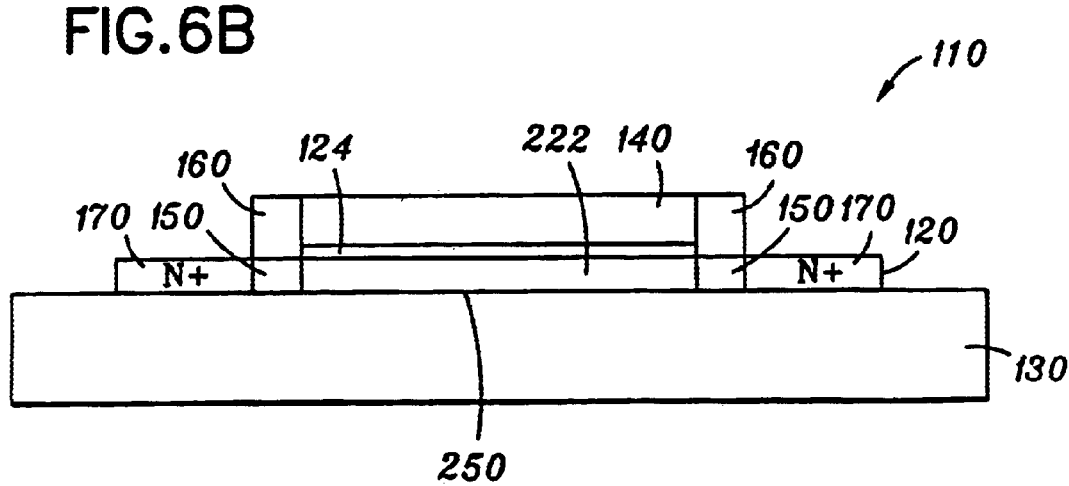
FIG. 6B shows a cross-section view of the basic charge injector/storage cell (EEPROM) shown in FIG. 6A.
Figure 7A:
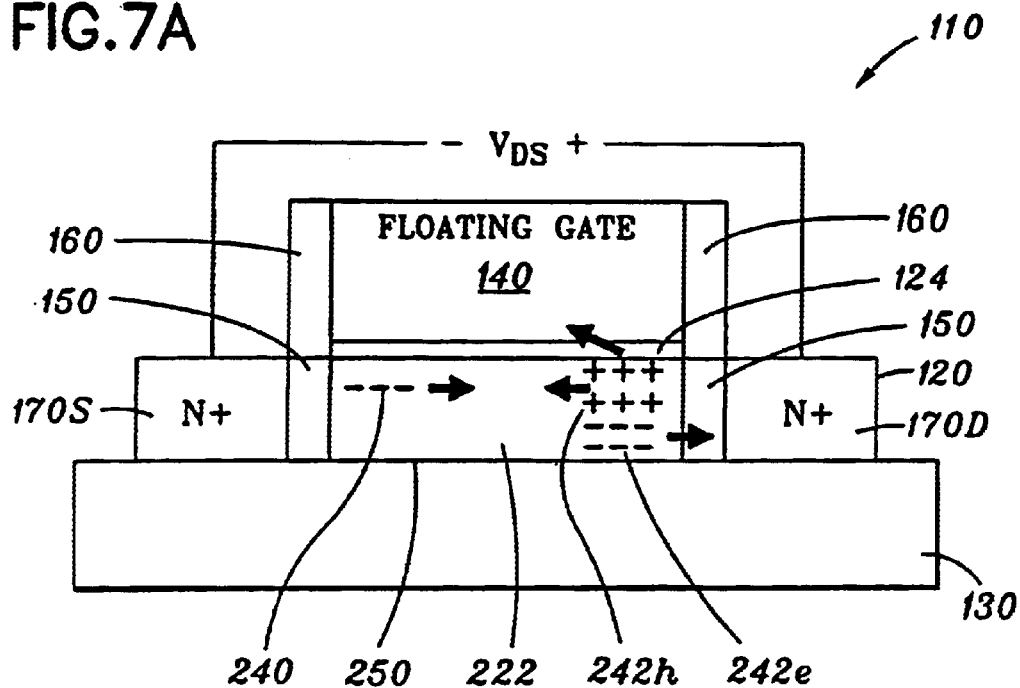
FIG. 7A shows a cross-section view of an avalanche injection mechanism for an N-channel basic charge injector/storage cell (EEPROM); the applied voltage $V_{DS}$ must exceed the avalanche voltage of the drain.

FIG. 6B shows a cross sectional view of the storage cell 110, cutting through the N-channel device 170. The P-channel device 180 is the same, except the N+ region 170 would be P+. Throughout this description, the N-channel device 170 will be described with the understanding that the P-channel device 180 is essentially the same unless differences are described. The device described in FIG. 6A and FIG. 6B is the basic charge injector/storage/EEPROM cell 110. Charge is injected onto the floating gate 140 where it is stored until charge of the opposite polarity is injected or until contact is made with the floating gate 140 to access the charge. As long as the floating gate 140 floats, the charge remains permanently since the floating gate 140 is encased in silicon dioxide. It can also be seen from FIG. 6A and FIG. 6B that the device 110 is manufactured with a standard, unmodified CMOS process. It can also be seen that the structure 110 can only be made in SOI material due to the folded nature of the N-channel and P-channel devices 170, 180. As will be seen, the device 110 is further enhanced if the MOS transistors 170, 180 are fully depleted. If this structure 110 were manufactured in bulk Si, the substrate 130 would have to be either P-type or N-type to provide junction isolation for either the N+ or P+ Source/Drain (S/D) regions 170, 180, respectively. However, while providing junction isolation for one of the transistors 170, 180, the same polarity would short the other S/D region 170, 180 through the substrate 130. It is the insulating substrate nature of the SOI substrate 130 which enables this structure 110 to provide both N- and P-channel devices 170, 180.

FIG. 6C and FIG. 6D show top and side views of an alternate structure 200 which differs from that shown in FIG. 6A and FIG. 6B by the addition of an injector region 210 in the channel 222 of the storage cell 200. The injector 210 is a hole in the channel 222 formed during the island 120 formation stage. If the CMOS process is a mesa isolated process, the injector 210 inherently penetrates to the insulating layer 130. If the process is LOCOS isolated, the injector 210 can be designed to penetrate to the insulating layer 130 or partially through the silicon channel 222. In FIG. 6D the injector 210 is shown penetrating to the insulating layer 130.

Operation of the Charge Injector/Storage/EEPROM Cell

There are two different mechanisms of operation: avalanche injection and channel hot electron (CHE) tunneling. Devices with and without the injector 210 can operate under avalanche injection while the injector 210 is necessary to enhance CHE injection. Avalanche injection will be described first.

Avalanche Injection

FIG. 7A depicts the avalanche injection mechanism for the N-channel device 170. The P-channel device 180 operates the same way, except polarities of voltages, currents and charge carriers are all reversed. For the N-channel device 170, a voltage $V_{DS}$ is applied between the two N+ regions 170S, 170D. Since the device 110 is completely floating, the only issue is the magnitude of the voltage drop between these regions 170S, 170D, not their absolute value with respect to the nearest ground. By definition, the most positive terminal will function as the drain 170D, (for the P-channel 180, the most negative terminal would function as the drain) so the applied voltage will be called $V_{DS}$. The voltage on the gate 140 with respect to the most negative terminal will be called $V_{GS}$.

FIG. 7A shows the behavior of the device 110 when $V_{DS} > V_{AV}$, where $V_{AV}$ is defined as the voltage at which avalanche multiplication starts to occur at the drain 170D. Under these conditions, electron-based leakage current 240 transfers from the source 170S to the drain 170D where they encounter the high electric field which induces avalanche multiplication. Avalanche multiplication is the quantum mechanical mechanism in which a high energy carrier (either electron or hole) interacts with a material (in this case the silicon) imparting enough energy to create a hole-electron pair 242h, 242e. The result is that the original particle 240 has now been multiplied to three: in this case one electron 240 is now two electrons and a hole 240, 242e, 242h. The two electrons 240, 242e may undergo the process many times, thereby increasing the current by orders of magnitude, hence the name. The mechanism is triggered by a critical electric field and is characterized by an almost instantaneously sharp increase in device current. It is also characterized in a MOSFET by a transition from conduction by a single carrier type (electrons in N-channel devices, holes in P-channel devices) to conduction by both carrier types (holes and electrons in both types of devices). Finally, the generated hole-electron pair 242h, 242e is often created with excess energy, thereby creating so called "hot" electrons and holes. When these characteristics are combined with a strong electric field from the drain 170D toward the floating gate 140, so-called hot carrier (hot holes in this case) injection occurs.

The polarity of hot carrier injection is such that the N-channel device 170 injects avalanche generated holes 242h onto the floating gate 140 which in turn charge the gate 140 positively with respect to its previous charge state of the N-channel device 170. When the applied $V_{DS}$ is removed, the gate 140 remains positively charged with respect to the entire N-channel device 170 since the channel is then at a uniform potential. With a stored positive charge on the gate 140, the N-channel device 170 is "on" and the P-channel device 180 is "off". Hence, the EEPROM cell 110 is now programmed to a "positive" ("+") state, arbitrarily defined herein as a "one" or "high".

The mechanism is the same for the P-channel device 180 wherein a voltage is applied to $V_{DS}$ sufficient to induce avalanche multiplication at the most negative terminal (but again not necessarily negative with respect to the nearest ground). In this case, normal holes create avalanche induced hole-electron pairs, the holes of which continue the avalanche mechanism. The hot electrons are accelerated by the now reversed electric field and are injected into the floating gate 140, thereby charging the gate 140 negatively with respect to the silicon. With a stored negative charge on the gate 140, the P-channel device 180 is "on" and the N-channel device 170 is "off". Hence, the charge injector/storage/EEPROM cell 110 is now programmed to a "negative" ("−") state, arbitrarily defined herein as a "zero" or "low".

Reading the state of the device 170, 180 is accomplished by applying a voltage to either the N-channel or P-channel MOSFET 170, 180. However, reading is affected by whether the device 170, 180 is fully depleted or partially depleted. In the fully depleted case, when one transistor 170 or 180 is "on", the other transistor 180 or 170, respectively, is inherently "off", a combination which is very valuable for numerous applications. For a partially depleted device, a conduction channel of one polarity exists under the depletion (and inversion) region near the silicon-insulator interface 250. This means both transistors 170, 180 would be "on" but with different drive strengths. The advantages of the fully depleted condition are sufficient that for the remainder of this document such a state will be assumed. However, it is recognized that fully depleted operation is an enhancement but it is not necessary to the basic EEPROM operation. There may even be applications or conditions wherein the partially depleted condition is preferable.

If a voltage is applied between the N+ or P+ terminals 170, 180, a current would be measured to read the device 170, 180. If a voltage is applied to one N+ or P+ terminal 170, 180, a voltage could be measured at the other N+ or P+ terminal 170, 180, respectively. For example if the gate 140 is stored positively, the N-channel 170 is "on" and the P-channel 180 is "off". A voltage applied to the NMOSFET 170 would result in high current (typically many microamps) while a voltage applied to the PMOSFET 180 would result in low current (typically picoamps). Either one can serve as the reading signal. If a voltage is applied to one N+ region 170, the voltage would be measured at the other N+ region 170 since the channel is in the n-type conduction state (i.e., it is accumulated with electrons). If a voltage is applied to one P+ region 180, the voltage would not be measured at the other P+ region 180 since the channel is in the n-type conduction state (i.e., it is accumulated with electrons) which holds the PMOS device 180 "off". The mechanism would be the same with reversed polarities if the device were programmed to a "−" state, i.e., voltage or current would pass through the PMOS device 180 and the NMOS device 170 would block such signals. Hence reading can be accomplished through either N or P type conduction and for either "+" or "−" stored charge.

There are obviously many variations on the details described above. For example, the voltage was applied to the N or P MOS devices 170, 180. However, the avalanche mechanism could also have been triggered by a reverse bias applied to any of the diodes present in the structure (in this case a positive voltage would be applied to either N+ region 170 with respect to either of the P+ regions 180. Also, the aspect ratio of the device 110, 200 could be altered; the shape could be different; doping concentrations in the channel 222, LDD 150, N+ and P+ regions 170, 180 could be changed; the shape of the silicon island 120 with respect to the floating gate 140 could be changed and virtually every aspect of the device 110, 200 could be modified to affect performance on writing voltage, speed, power consumption, charge storage, etc. in accordance with standard design practice. The purpose of this document is only to define the basic mechanisms without implying any restrictions on various options.

With both mechanisms available to the same floating gate 140, the device 110, 200 can be electrically programmed to both a "high" and a "low" state. This is a capability which was not available to original avalanche induced EPROM devices which in turn required UV erasure. It was the same limitation which forced a dual gate solution to be sought to provide EEPROM, thereby adding the disadvantages discussed above. In the current device 110, 200, it can be seen that no additional processing steps are required to provide full EEPROM capability.

Channel Hot Carrier (CHC) Injection

Figure 7B:
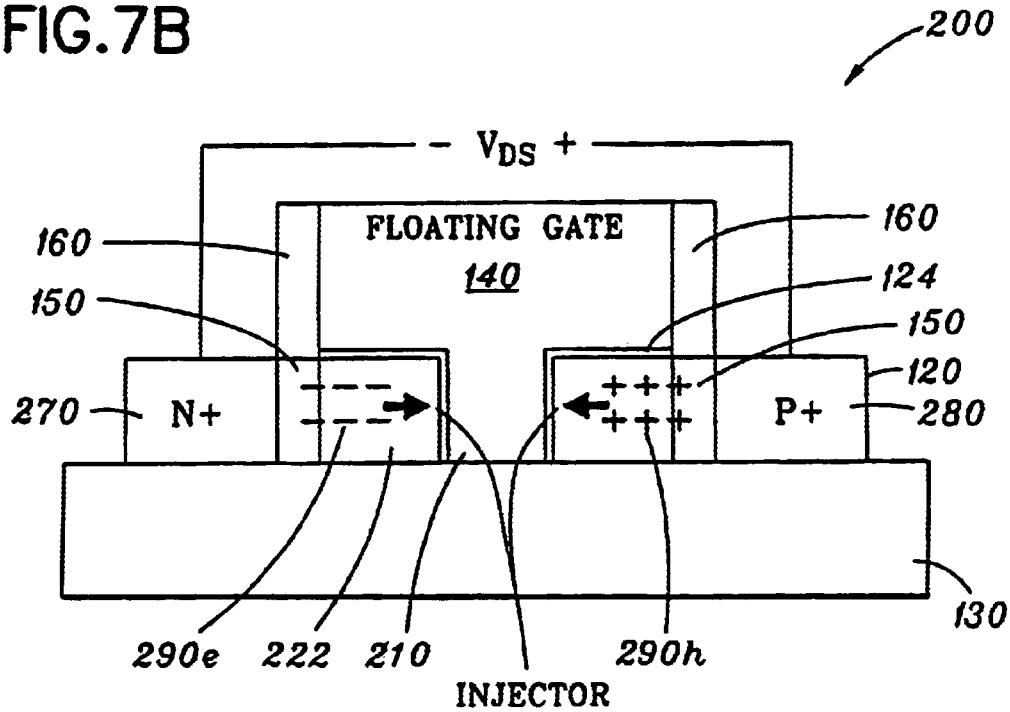
FIG. 7B illustrates the CHE injection mechanism as shown by a cross section through an N+ region and a P+ region of a basic charge injector/storage cell (EEPROM).

FIG. 7B shows an alternative mechanism for writing both polarity charges onto the floating gate 140. The mechanism is based on using the excess energy and momentum of carriers provided by either a forward biased diode 270, 280 or a conducting MOS transistor. FIG. 7B shows the case of a forward biased diode 270, 280 since both an N+ 270 and a P+ 280 region are shown. If both doped regions 270, 280 were the same polarity, the devices would be MOSFETs instead of diodes, and the current flow would be only of the same polarity as the S/D doped regions.

When the diode 270, 280 is forward biased, electrons 290e are injected by the N+ region 270 and holes 290h are injected from the P+ region 280. They recombine with each other as they traverse the length of the device. Remembering that the injector 210 is in the center of the device 270, 280, most of the diode current passes around the injector 210. However, for current which encounters the injector 210, some of the charge will have sufficient energy and momentum to penetrate the gate oxide 124 onto the floating gate 140, thereby charging the floating gate 140.

Since both holes 290h and electrons 290e are involved in diode current, both may be injected onto the floating gate 140. Hence the physical location of the injector 210 with respect to the diode junctions along with the relative concentrations of holes 290h and electrons 290e at the injector 210 will determine which polarity carrier will be injected in the majority which in turn determines the polarity of net charge on the floating gate 140. (For MOSFET injection, this issue does not exist since its conduction is unipolar, i.e., majority carriers only).

The CHC injection mechanism offers several advantages. This mechanism operates at very low voltages, in theory requiring only 0.7 V to start the injection process in the case of diode injection, and even less for MOSFET injection. Writing efficiency and speed will determine the actual voltages used, since higher voltage will increase the current and associated injection current. Operation at such low voltages eliminates the need for any charge pumps and also increases reliability of the device 200. It also solves a long-term problem of providing EEPROM for space applications which can be destroyed if during a high voltage writing step a high energy particle penetrates the cell. Under these circumstances a traditional EEPROM cell can be physically destroyed, an issue which has limited the use of EEPROM in satellites and other radiation sensitive applications.

The injection current also occurs in proportion to the silicon device current (diode or MOSFET), so the amount of charge on the gate 140 can be controlled by controlling the device current. This enables both control of overwriting and it also enables an analog memory capability in addition to the digital EEPROM discussed above.

Also, in the case of diode injection, both polarity carriers are available, so multiple design options can be considered for the cell 200 based on injector 210 locations (there can be multiple injectors 210), dopant concentrations in the LDD 150 and channel regions 222 and size and location of the floating gate 140 with respect to the silicon channel 222.

How the charge was injected does not affect how the cell's state is read. Hence, reading the cell 200 is the same as discussed above for the avalanche injection. A difference is if the device current is measured, presence of the injector 210 reduces the amount of current resulting from a given applied voltage.

Charge Injector/Storage/EEPROM Device Alternatives

Structural Variations

Figure 10:
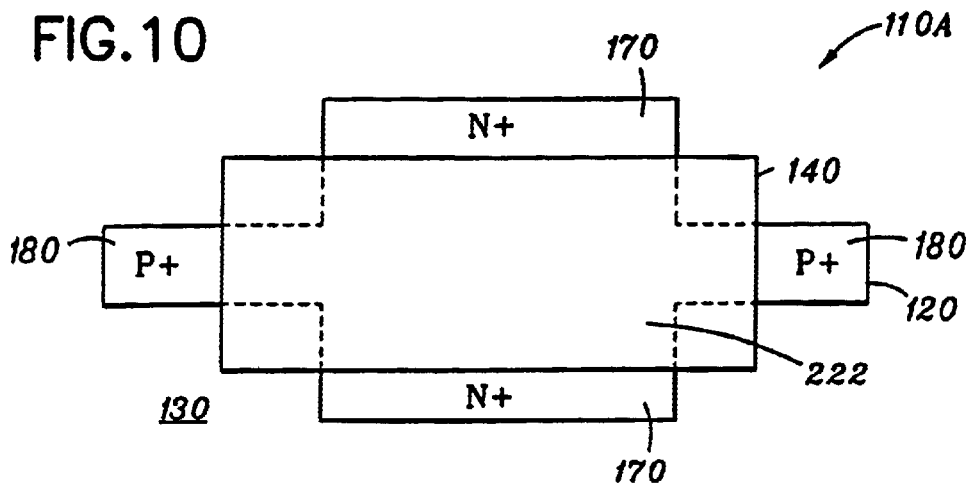
FIG. 10 shows a configuration of the charge injector/storage cell, i.e. EEPROM cell, with increased aspect ratio for the N-channel device.
Figure 11:
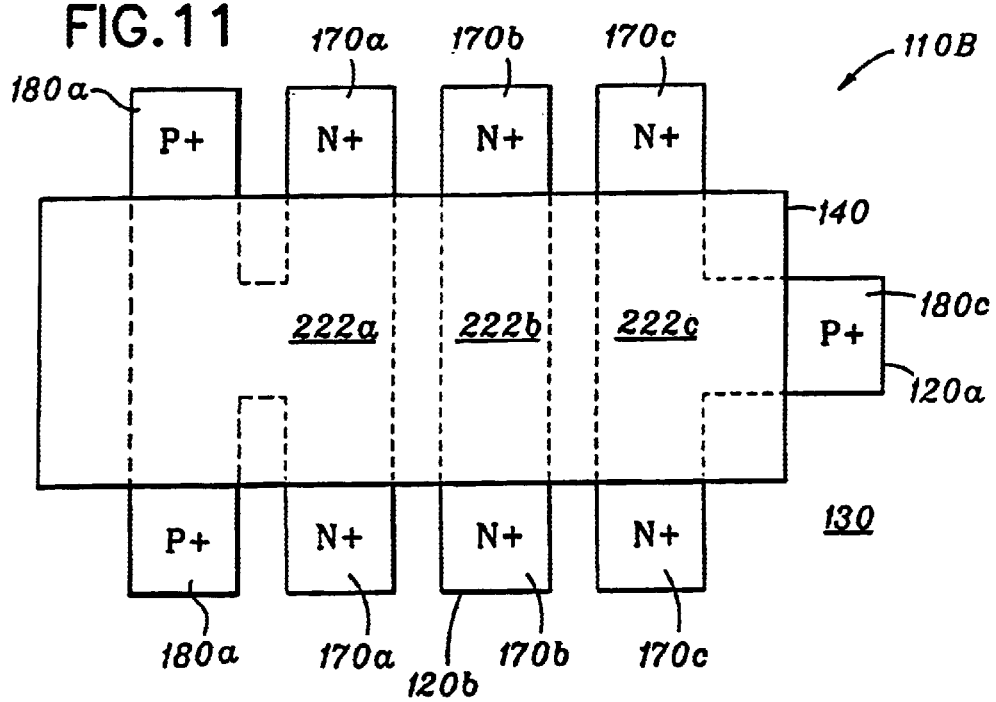
FIG. 11 shows a configuration of the charge injector/storage cell, i.e. EEPROM cell, with multiple Si islands for a single floating gate.
Figure 12:
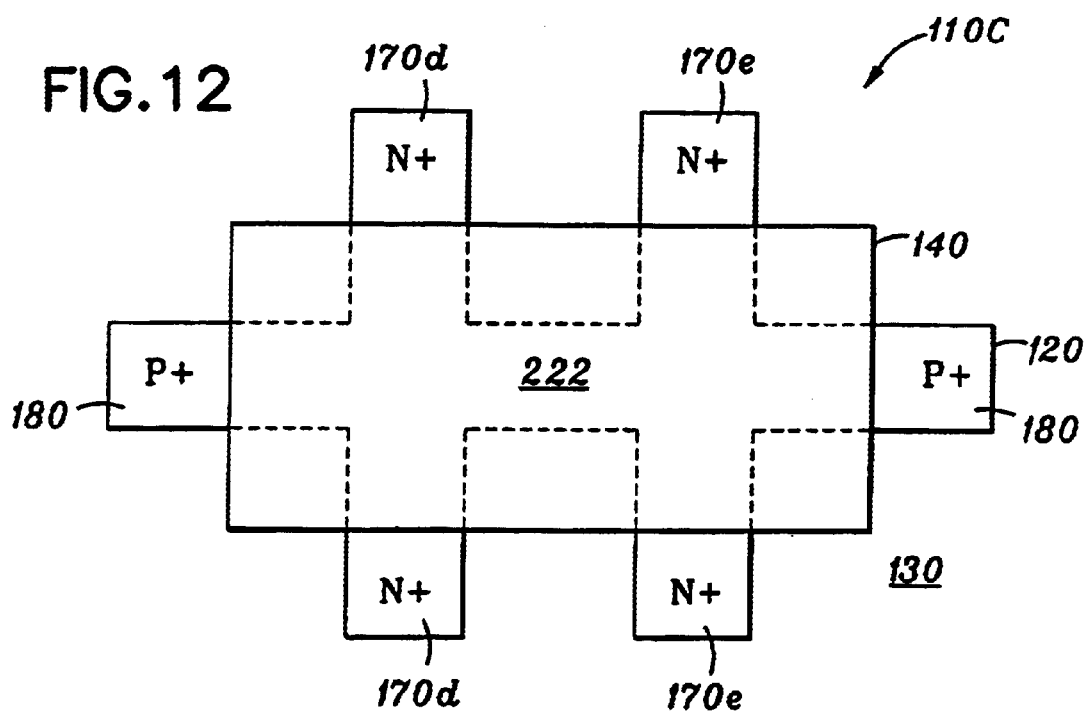
FIG. 12 shows a configuration of the charge injector/storage cell, i.e. EEPROM cell, with multiple read or write ports.

The top views shown in FIG. 6A and FIG. 6C can be modified in virtually all dimensions as well as in the number of contact points. For example, either the N- or P-channel device 170, 180 can be longer or wider to enhance read or write strength (see embodiment 110A in FIG. 10). Additionally, the silicon island 120 can be separated into multiple sections 120a, 120b, 120c to provide multiple read or write points for a single cell 110B or multiple strength read or write signals (see embodiment 110B in FIG. 11). Also, the device can be designed to have multiple contact regions (see embodiment 110C in FIG. 12). The channel regions 222 can also have non-uniform dopant concentrations. For example the channel region 222 adjacent the LDD 150 for either polarity transistor can have different amount and type of dopant to enhance either read or write performance. Some of these ideas are demonstrated in FIG. 10, FIG. 11, and FIG. 12.

These variations as shown above are on structures without injectors 210. Obviously it is possible to consider combinations of both, i.e., regions without injectors 210 written with avalanche injection and regions with injectors 210 written with CHC injection. Such structures can combine digital and analog memory, fast and slow write options and many other uses. It is also possible to consider variations of the number, location, and size of the injectors 210. Since N+ regions inject electrons and P+ regions inject holes, injector spacing and design affects carrier injection performance. A hole near a P+ region will receive increased hole injection while one near an N+ region will receive increased electron injection.

Also, the size and depth of the injector 210 will also affect injector and cell performance. Larger full-depth injectors will increase carrier injection but decrease read current. Injectors which penetrate only partially through the silicon film 120 can see reduced carrier injection but increase read current.

Clearly there are many more implementations of the cell 110, 200 which can be considered and utilized for multiple applications. The purpose of these figures is to select only a few without creating any limitation on other designs which could impact other applications.

Operational Variations

There are also other methods of writing or reading the cells 110, 200. For example, since the gate material is the same for both the NMOS device 170 and the PMOS device 180, the difference in threshold voltages of these two devices will be approximately equal to the band gap of silicon, or approximately 1 V. Therefore the device can be programmed to a third unique state by storing a voltage between the two threshold voltages. Under such conditions, both the NMOS 170 and PMOS 180 device will be "off", which is different from the previously discussed states of one transistor always "on". This operation would be a tri-state (or trinary) memory cell which has many potential uses. The most obvious is that the effective memory density would be increased by 50% (3 pieces of information per cell versus 2). Multi-state logic has received much attention in the literature, and this cell could find use in such architectures.

There is an additional feature of this device which warrants some discussion. When the cell 110, 200 is manufactured, the floating gate 140 may have little or no charge on it. However, after programming, the channel region 222 is accumulated with either holes or electrons. The polarity of the charge dictates where the metallurgical junctions are located. That is, if the channel 222 is accumulated with holes they form a diode junction at the N+ regions 170 (and there is no junction at the P+ region 180). Conversely, if the channel 222 is accumulated with electrons they form a diode junction at the P+ regions 180 (and there is no junction at the N+ region 170). This affects design of the injector 210 for ballistic injection since the junction location is determined by the charge state of the floating gate 140. For example if the floating gate 140 is positively charged, the channel 222 is accumulated with electrons and an injector near an N+ region 170 would not be at the metallurgical junction. For a negatively charged floating gate 140, such an injector 210 would be at the metallurgical junction. Since the injector efficiency is affected by the surrounding charge type and electric field this effect must be included in cell 110, 200 design.

Avalanche injection is not affected by the location of the metallurgical junction since it will be reverse biased regardless of its physical location. However, the breakdown characteristics of the junction are determined by the carrier concentration on both sides of the metallurgical junction. One side is set by the LDD 150 doping concentration while the other side is determined by the carrier concentration induced by the floating gate 140. There is an optimum carrier concentration for carrier injection. If the carrier concentration is low, the avalanche voltage will be relatively high. If the carrier concentration is too high, however, gate induced drain leakage (GIDL) can occur which can prevent avalanche breakdown. This can prevent avalanche carrier injection.

This effect can have a benefit by self-limiting avalanche injection. Avalanche injection increases carrier concentration until the GIDL effect swamps the avalanche effect as the dominant junction breakdown mechanism. Without avalanche multiplication, there are no hot carriers and charge injection onto the floating gate 140 ceases, thereby limiting the total amount of charge injected. By properly designing the cell 110, 200 this mechanism can ensure accurate writing levels and prevent over-writing.

Summary, Ramifications and Scope

Although the description above contains many specificities, these should not be construed as limiting the scope of the invention but as merely providing illustrations of some of the presently preferred embodiments of this invention. Additionally, some of the above specificities have been included solely for the purpose of illustrating selected characteristics of the present invention by example. For example, there are many variables which can be used to optimize performance or power, speed, voltage, manufacturability, retention, and noise margin, radiation hardness, cell size and others. These variables include, size, shape, location and orientation of each element of the varactor and injector, including but not limited to size, shape, location and orientation of N (N−), P (P−), N+, P+, LDD's, islands, injector sites, poly gate layer(s) and contacts. Also, doping choices and levels as well as gate oxide thickness and dimensions and island thickness and dimensions can be modified. Operating voltages and currents can also be used to optimize performance. All such variations are envisioned in this invention. Also, any silicon or Si/Ge layers which support MOS devices on any insulator can be used. All such variations are envisioned in this invention. Also, any semiconductor material that supports MOS devices on any substrate can be used, although non-insulating substrates will have parasitic substrate capacitances that must be included in the design and performance of the final varactor.

Thus, the scope of the invention should be determined by the appended claims and their legal equivalents, rather than by the foregoing description and examples given. All changes which come within the meaning and range of equivalency of the claims are to be embraced within their scope.

What is claimed is:

1. A variable capacitor comprising:

a first insulating substrate;

a first semiconductive region of a first conductivity type having a first resistivity value formed on said first insulating substrate;

a second semiconductive region of said first conductivity type having a second resistivity value formed on said first insulating substrate wherein said first and second semiconductive regions are electrically coupled;

a first electrode electrically coupled to said second semiconductive region;

a first gate which is electrically floating and is capacitively coupled to said first semiconductive region, wherein a capacitance $C_1$ represents the capacitive coupling between said floating first gate and said first semiconductive region;

a conducting region capacitively coupled to said first floating gate, wherein a capacitance $C_2$ represents the capacitive coupling between said conducting region and said first floating gate;

a second electrode electrically coupled to said conducting region; and a charge injector directly connected to said first floating gate, for injecting charge into said first floating gate.

2. A variable capacitor as defined in claim 1 wherein said insulating substrate further comprises sapphire.

3. A variable capacitor as defined in claim 1 further comprising a third semiconductive region of said first conductivity type having a third resistivity value formed on said insulating substrate positioned between said first and second semiconductive regions wherein said third semiconductive region is electrically coupled to said first and second semiconductive regions.

4. A variable capacitor as defined in claim 1 wherein said first semiconductive region further comprises an N type semiconductor and said second semiconductive region further comprises an $N^+$ type semiconductor.

5. A variable capacitor as defined in claim 1 further comprising at least one electrically insulating region which electrically insulates said first semiconductive region, said floating first gate and said conducting region from each other, wherein said first capacitance $C_1$ between said floating first gate and said first semiconductive region further comprises an insulator/oxide capacitance $C_{OX}$ and a depletion capacitance $C_{DEP}$ wherein said depletion capacitance $C_{DEP}$ varies as a function of a voltage applied between said first and second electrodes.

6. A variable capacitor as defined in claim 1 which exhibits a first total capacitance $C_{T1}$ when a voltage $V_1$ is applied between said first and second electrodes and a second total capacitance $C_{T2}$ when a voltage $V_2$ is applied between said first and second electrodes, wherein the difference between the first and second total capacitances, $(C_{T2}-C_{T1})$, is a function of the capacitance $C_2$ between said conducting region and said floating first gate.

7. A variable capacitor as defined in claim 1, wherein said charge injector is formed on said first insulating substrate.

8. A variable capacitor comprising:
    a first insulating substrate;
    a first semiconductive region of a first conductivity type having a first resistivity value formed on said first insulating substrate;
    a second semiconductive region of said first conductivity type having a second resistivity value formed on said first insulating substrate wherein said first and second semiconductive regions are electrically coupled;
    a first electrode electrically coupled to said second semiconductive region;
    a first gate which is electrically floating and is capacitively coupled to said first semiconductive region, wherein a capacitance $C_1$ represents the capacitive coupling between said floating first gate and said first semiconductive region;
    a conducting region capacitively coupled to said first floating gate, wherein a capacitance $C_2$ represents the capacitive coupling between said conducting region and said first floating gate;
    a second electrode electrically coupled to said conducting region; and
    a charge injector electrically coupled to said first floating gate, for injecting charge into said first floating gate, wherein said charge injector comprises:
        a first injector region and a second injector region of a first conductivity type separated by an injector channel region positioned between said first and second injector regions; and
        a third injector region of a second conductivity type which is adjacent to said injector channel region; and
        an injector floating gate positioned over said injector channel region wherein said injector floating gate is electrically coupled to said first floating gate and injects charge onto said first floating gate.

9. A variable capacitor as defined in claim 1, wherein said variable capacitor exhibits:
    a first total capacitance $C_{T1}$ when a voltage $V_1$ is applied between said first and second electrodes and a second total capacitance $C_{T2}$ when a voltage $V_2$ is applied between said first and second electrodes; and
    a midpoint capacitance between $C_{T1}$ and capacitance $C_{T2}$ at a midpoint voltage $V_{MID}$ between voltage $V_1$ and voltage $V_2$, wherein the value of the midpoint voltage $V_{MID}$ is a function of the charge injected onto said first floating gate from said charge injector.

10. A variable MOS capacitor comprising:
    a first semiconductive region of a first conductivity type having a first resistivity value;
    a second semiconductive region of said first conductivity type having a second resistivity value wherein said first and second semiconductive regions are electrically coupled;
    a first electrode electrically coupled to said second semiconductor region;
    a first gate which is electrically floating and is capacitively coupled to said first semiconductive region, wherein a capacitance $C_1$ represents the capacitive coupling between said first floating gate and said first semiconductive region;
    a conducting region capacitively coupled to said first floating gate, wherein a capacitance $C_2$ represents the capacitive coupling between said conducting region and said first floating gate; and
    a second electrode electrically coupled to said conducting region; and
    a charge injector directly connected to said first floating gate for injecting charge onto said first floating gate.

11. A variable MOS capacitor as defined in claim 10 further comprising an insulating substrate, wherein said first and second semiconductive regions are formed on said insulating substrate.

12. A variable MOS capacitor as defined in claim 11 wherein said insulating substrate further comprises sapphire.

13. A variable MOS capacitor as defined in claim 10 further comprising a third semiconductive region of said first conductivity type having a third resistivity value positioned between said first and second semiconductor regions wherein said third semiconductive region is electrically coupled to said first and second semiconductive regions.

14. A variable MOS capacitor as defined in claim 10 wherein said first semiconductive region further comprises an N type semiconductor and said second semiconductive region further comprises an $N^-$ type semiconductor.

15. A programmable MOS capacitor comprising:
    a first semiconductive region of a first conductivity type having a first resistivity value;
    a second semiconductive region of said first conductivity type having a second resistivity value wherein said first and second semiconductive regions are electrically coupled;
    an electrical contact in electrical contact with said second semiconductor region;
    a first gate which is electrically floating and is capacitively coupled to said first semiconductive region, wherein said first floating gate overlaps at least a portion of said first semiconductive region thereby enabling a depletion capacitance to be formed in said first semiconductive region;
    a first insulating region positioned between said first semiconductive region and said floating first gate;
    a conducting region capacitively coupled to said first floating gate; and
    a charge injector directly connected to said first floating gate for injecting charge onto said first floating gate.

16. A programmable MOS capacitor as defined in claim 15 further comprising an insulating substrate, wherein said first and second semiconductive regions are formed on said insulating substrate.

17. A programmable MOS capacitor as defined in claim 16 wherein said insulating substrate further comprises sapphire.

18. A programmable MOS capacitor as defined in claim 15 further comprising a third semiconductive region of said first conductivity type having a third resistivity value positioned between said first and second semiconductor regions wherein said third semiconductive region is electrically coupled to said first and second semiconductive regions.

19. A programmable MOS capacitor as defined in claim 15 wherein said first semiconductive region further comprises an N type semiconductor and said second semiconductor region further comprises an $N^+$ type semiconductor.

20. A MOS capacitor comprising:
    a first semiconductive region of a first conductivity type having a first resistivity value;
    a second semiconductive region of said first conductivity type having a second resistivity value wherein said first and second semiconductive regions are electrically coupled;
    a floating gate which overlaps at least a portion of said first semiconductive region wherein a depletion region is formed; and
    a charge injector electrically coupled directly connected to said floating gate for injecting charge onto said floating gate.

21. A MOS capacitor as defined in claim 20 further comprising an insulating substrate, wherein said first and second semiconductive regions are formed on said insulating substrate.

22. A MOS capacitor as defined in claim 21 wherein said insulating substrate further comprises sapphire.

23. A MOS capacitor as defined in claim 20 further comprising a third semiconductive region of said first conductivity type having a third resistivity value positioned between said first and second semiconductive regions wherein said third semiconductive region is electrically coupled to said first and second semiconductive regions.

24. A MOS capacitor as defined in claim 20 wherein said first semiconductive region further comprises an N type semiconductor and said second semiconductive region further comprises an $N^+$ type semiconductor.

* * * * *

UNITED STATES PATENT AND TRADEMARK OFFICE
CERTIFICATE OF CORRECTION

PATENT NO. : 6,667,506 B1  Page 1 of 1
DATED : December 23, 2003
INVENTOR(S) : Reedy et al.

It is certified that error appears in the above-identified patent and that said Letters Patent is hereby corrected as shown below:

<u>Column 22,</u>
Line 38, "N"" should be -- $N^+$ --

Signed and Sealed this

Sixteenth Day of March, 2004

JON W. DUDAS
*Acting Director of the United States Patent and Trademark Office*